(12) United States Patent
Phan et al.

(10) Patent No.: US 6,999,254 B1
(45) Date of Patent: Feb. 14, 2006

(54) REFRACTIVE INDEX SYSTEM MONITOR AND CONTROL FOR IMMERSION LITHOGRAPHY

(75) Inventors: Khoi A. Phan, San Jose, CA (US); Bharath Rangarajan, Sunnyvale, CA (US); Bhanwar Singh, Morgan Hill, CA (US); Ramkumar Subramanian, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/967,845

(22) Filed: Oct. 18, 2004

Related U.S. Application Data

(63) Continuation of application No. 10/645,363, filed on Aug. 21, 2003, now Pat. No. 6,844,206.

(51) Int. Cl.
*G02B 7/00* (2006.01)
(52) U.S. Cl. .................................................... 359/896
(58) Field of Classification Search ................... 438/5, 438/7, 16; 430/30
See application file for complete search history.

(56) References Cited

U.S. PATENT DOCUMENTS

| 5,610,683 | A | 3/1997 | Takahashi |
| 5,715,039 | A | 2/1998 | Fukuda et al. |
| 5,879,866 | A | 3/1999 | Starikov et al. |
| 5,900,354 | A | 5/1999 | Batchelder |
| 6,309,809 | B1 | 10/2001 | Starikov et al. |
| 6,448,568 | B1 | 9/2002 | Allen et al. |
| 6,781,670 | B2 | 8/2004 | Krautschik |
| 6,788,477 | B2 | 9/2004 | Lin |
| 2002/0163629 | A1 | 11/2002 | Switkes et al. |
| 2003/0123040 | A1 | 7/2003 | Almogy |
| 2003/0174408 | A1 | 9/2003 | Rostalski et al. |
| 2004/0075895 | A1 | 4/2004 | Lin |
| 2004/0109237 | A1 | 6/2004 | Epple et al. |
| 2005/0018208 | A1 * | 1/2005 | Levinson ................. 356/517 |
| 2005/0046813 | A1 | 3/2005 | Streefkerk et al. |

FOREIGN PATENT DOCUMENTS

| GB | 2 141 223 A | 12/1984 |
| WO | WO 99/49504 A | 9/1999 |
| WO | WO 2005/013008 A2 | 2/2005 |

OTHER PUBLICATIONS

International Search Report, PCT/US2004/026716, mailed May 20, 2005.

* cited by examiner

*Primary Examiner*—Scott Geyer
(74) *Attorney, Agent, or Firm*—Amin & Turocy, LLP

(57) ABSTRACT

A system and/or method are disclosed for measuring and/or controlling refractive index (n) and/or lithographic constant (k) of an immersion medium utilized in connection with immersion lithography. A known grating structure is built upon a substrate. A refractive index monitoring component facilitates measuring and/or controlling the immersion medium by utilizing detected light scattered from the known grating structure.

35 Claims, 16 Drawing Sheets

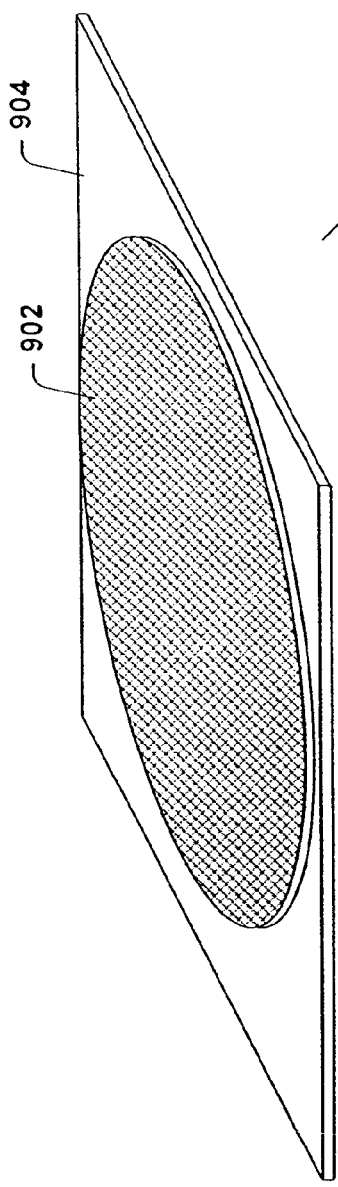
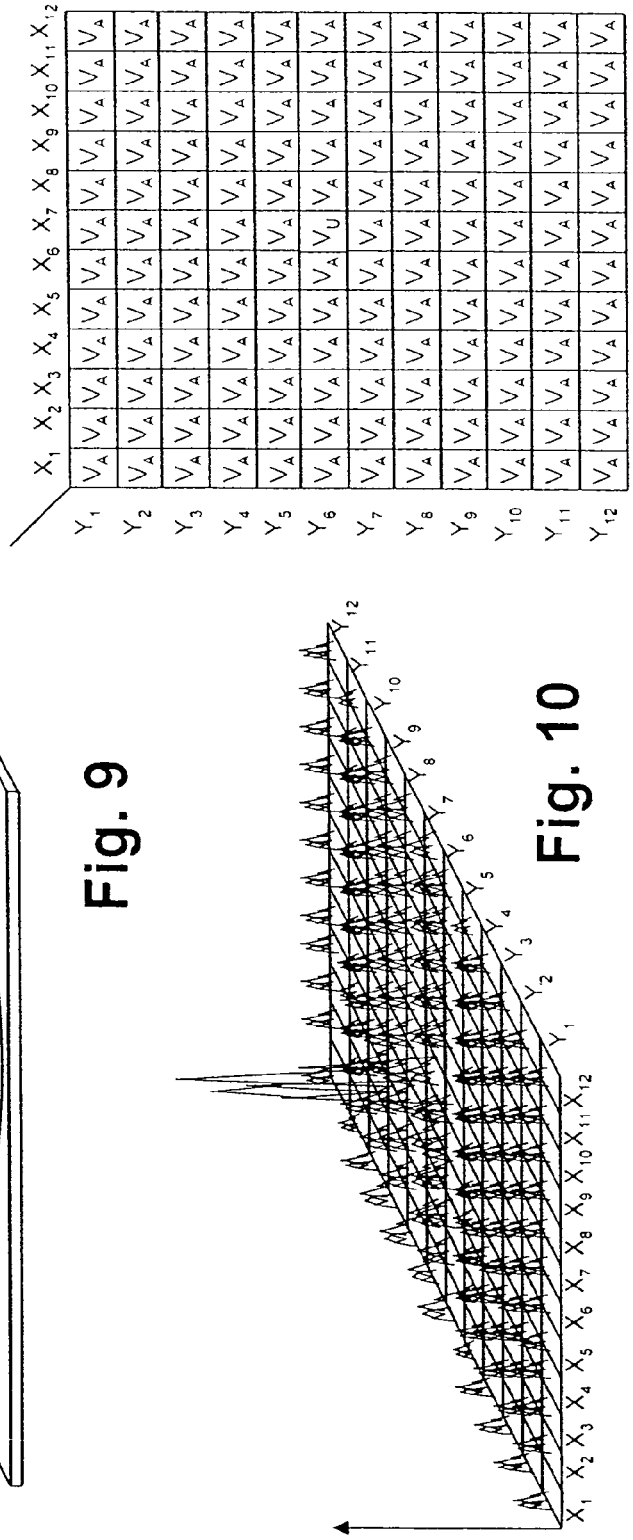
Fig. 9
Fig. 10
Fig. 11

REFRACTIVE INDEX SYSTEM MONITOR AND CONTROL FOR IMMERSION LITHOGRAPHY

CROSS-REFERENCE TO RELATED APPLICATIONS

This application is a continuation of U.S. patent application Ser. No. 10/645,363, filed on Aug. 21, 2003, now U.S. Pat. No. 6,844,206 entitled REFRACTIVE INDEX SYSTEM MONITOR AND CONTROL FOR IMMERSION LITHOGRAPHY, hereby incorporated herein by reference.

TECHNICAL FIELD

The present invention generally relates to semiconductor processing and, more particularly, to a system and method for monitoring and/or controlling refractive index of an immersion medium utilized in connection with immersion lithography.

BACKGROUND OF THE INVENTION

In the semiconductor industry, there is a continuing trend toward higher device densities. To achieve these high device densities there have been, and continue to be, efforts toward scaling down device dimensions (e.g., at sub-micron levels) on semiconductor wafers. In order to accomplish such densities, smaller feature sizes and more precise feature shapes are required. This may include width and spacing of interconnecting lines, spacing and diameter of contact holes, and surface geometry, such as corners and edges, of various features. The dimensions of and between such small features can be referred to as critical dimensions (CDs). Reducing CDs and reproducing more accurate CDs facilitates achieving higher device densities.

High resolution lithographic processes are used to achieve small features. In general, lithography refers to processes for pattern transfer between various media. In lithography for integrated circuit fabrication, a silicon slice, the wafer, is coated uniformly with a radiation-sensitive film, the photoresist. The film is selectively exposed with radiation (e.g., optical light, x-ray, electron beam, . . . ) through an intervening master template (e.g., mask, reticle, . . . ) forming a particular pattern (e.g., patterned resist). Dependent upon coating type, exposed areas of the coating become either more or less soluble than unexposed areas in a particular solvent developer. More soluble areas are removed with the developer in a developing step, while less soluble areas remain on the silicon wafer to form a patterned coating. The pattern corresponds to either the image of the mask or its negative. The patterned resist is used in further processing of the silicon wafer.

Efforts to reduce CDs have included implementing various techniques in connection with the lithographic process, such as reducing exposure radiation wavelength (e.g., from 436 nm mercury g-line to 365 nm i-line to 248 nm DUV to 193 nm excimer laser), improving optical design, utilizing metrology techniques (e.g., scatterometry, scanning electron microscope (SEM)), etc. Immersion lithography facilitates further reduction of CDs.

In immersion lithography, the gap between a substrate (e.g., wafer) and a final optical component (e.g., lens) is filled with an immersion medium, which has a higher refractive index than air. Refractive index is defined as a ratio of speed of light in a vacuum to speed of light in a particular medium. Utilizing an immersion medium with a refractive index greater than that of air, which approximately equals 1, can increase numerical aperture, which is defined as a lens's ability to gather diffracted light and resolve fine details onto a wafer. Furthermore, utilization of an immersion medium can decrease an effective wavelength of an exposure radiation propagating within the immersion medium without changing exposure radiation, lasers, lens materials, etc.

Currently, immersion lithography is limited by an inability to monitor and control immersion medium properties such as, for example, refractive index (n) and lithography constant (k). Conditions that can impact these properties include, for example, temperature, pressure, formation of microbubbles, chemical contamination of fluid, thermal and mechanical changes, etc. These conditions can impact efficiency of immersion lithography systems and can elevate costs for expensive immersion mediums. Thus, there exists a need in the art for systems and methods that can monitor and/or control immersion medium properties.

SUMMARY OF THE INVENTION

The following presents a simplified summary of the invention in order to provide a basic understanding of some aspects of the invention. This summary is not an extensive overview of the invention. It is intended to neither identify key or critical elements of the invention nor delineate the scope of the invention. Its purpose is merely to present some concepts of the invention in a simplified form as a prelude to the more detailed description that is presented later.

The present invention provides a system and method for monitoring and/or controlling refractive index and lithographic constant values of an immersion medium. An immersion medium in accordance with the invention can occupy a gap between a final optical component and a substrate, and have a refractive index greater than air. Furthermore, according to another aspect of the present invention, the immersion medium can be 100% transparent to an exposure wavelength. Additionally, the immersion medium can be water, supercritical fluid in gaseous phase, ozone vapor, etc. A known grating structure is constructed upon the substrate—a refractive index monitoring component emits an incident beam that interacts with the immersion medium and the known grating structure upon the substrate to produce a reflected and/or diffracted beam(s). The reflected and/or diffracted beam is analyzed to derive characteristics of the immersion medium such as, for example refractive index (n) and lithographic constant (k) values. According to an aspect of the present invention, the refractive index monitoring component can effectuate changes in refractive index and/or lithographic constant of the immersion medium by means of varying temperature, pressure, flushing the immersion medium, etc.

Another aspect of the present invention provides a system for measuring and/or controlling refractive index of an immersion medium. The system includes a refractive index monitoring component comprising a measuring component and a control component. The measuring component utilizes a light source which emits light that interacts with an immersion medium and a known grating structure, and a detector which can receive reflected and/or diffracted light. Refractive index and lithographic constant values can be derived employing information related to the emitted and received beams.

Another aspect of the present invention provides a method for measuring and/or controlling refractive index of an immersion medium. A substrate with a known grating structure built upon it is at least partially immersed in an immersion medium. An incident light beam is emitted into the immersion medium and onto the substrate. As a result, characteristics of the immersion medium such as, for example, refractive index and lithographic constant, can be derived. Furthermore, changes to such characteristics of the immersion medium can be effectuated by means of changing temperature, pressure, etc. of the immersion medium.

To the accomplishment of the foregoing and related ends, certain illustrative aspects of the invention are described herein in connection with the following description and the annexed drawings. These aspects are indicative, however, of but a few of the various ways in which the principles of the invention may be employed and the present invention is intended to include all such aspects and their equivalents. Other advantages and novel features of the invention will become apparent from the following detailed description of the invention when considered in conjunction with the drawings.

BRIEF DESCRIPTION OF THE DRAWINGS

FIG. 9 illustrates a perspective view of a grid-mapped wafer according to one or more aspects of the present invention.

FIG. 10 illustrates plots of measurements taken at grid-mapped locations on a wafer in accordance with one or more aspects of the present invention.

FIG. 11 illustrates a table containing entries corresponding to measurements taken at respective grid-mapped locations on a wafer in accordance with one or more aspects of the present invention.

DETAILED DESCIPTION OF THE INVENTION

Figure 1:
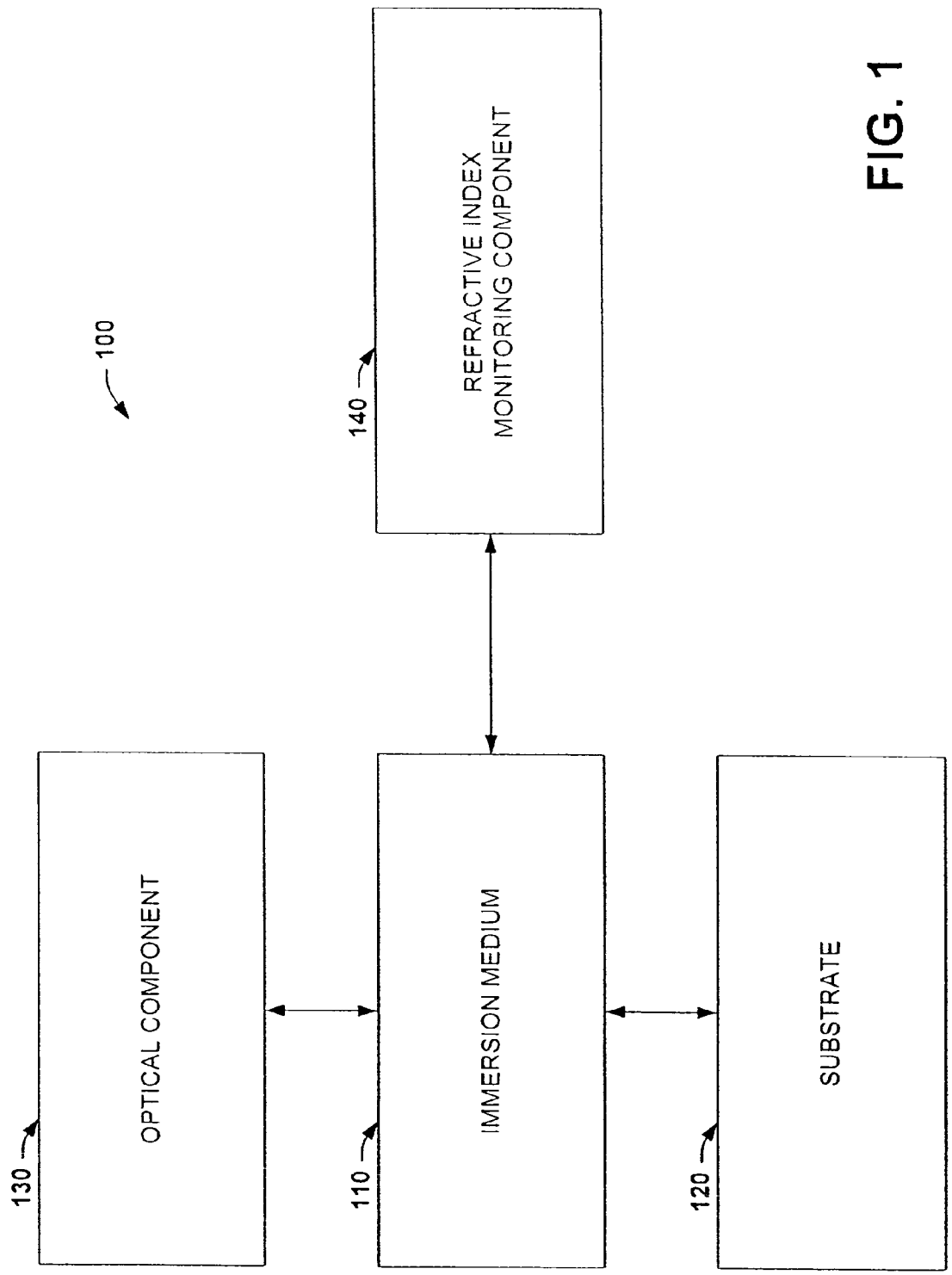
FIG. 1 is an illustration of a system for measuring and/or controlling refractive index of an immersion medium in accordance with an aspect of the present invention.

The present invention is now described with reference to the drawings, wherein like reference numerals are used to refer to like elements throughout. In the following description, for purposes of explanation, numerous specific details are set forth in order to provide a thorough understanding of the present invention. It may be evident, however, to one skilled in the art that one or more aspects of the present invention may be practiced with a lesser degree of these specific details. In other instances, known structures and devices may be shown in block diagram form in order to facilitate describing one or more aspects of the present invention.

As used in this application, the term "component" is intended to refer to a computer-related entity, either hardware, a combination of hardware and software, software, or software in execution. For example, a component may be, but is not limited to being a process running on a processor, a processor, an object, an executable, a thread of execution, a program, a set of co-operating computers and/or processes and a computer.

It is to be appreciated that various aspects of the present invention can employ technologies associated with facilitating unconstrained optimization and/or minimization of error costs. Thus, non-linear training systems/methodologies (e.g., back propagation, Bayesian, fuzzy sets, non-linear regression, or other neural networking paradigms including mixture of experts, cerebella model arithmetic computer (CMACS), radial basis functions, directed search networks, and function line networks) can be employed. The invention can employ various inference schemes and/or techniques in connection with state determination, inference and/or prediction. As used herein, the term "inference" refers generally to the process of reasoning about or inferring states of the system, environment, and/or user from a set of observations as captured via events and/or data. Inference can be employed to identify a specific context or action, or can generate a probability distribution over states, for example. The inference can be probabilistic—that is, the computation of a probability distribution over states of interest based on a consideration of data and events. Inference can also refer to techniques employed for composing higher-level events from a set of events and/or data. Such inference results in the construction of new events or actions from a set of observed events and/or stored event data, whether or not the events are correlated in close temporal proximity, and whether the events and data come from one or several event and data sources. Various classification schemes and/or systems (e.g., support vector machines, neural networks, expert systems, Bayesian belief networks, fuzzy logic, data fusion engines . . . ) can be employed in connection with performing automatic and/or inferred action in connection with the subject invention.

FIG. 1 illustrates a block diagram of a system 100 for measuring and/or controlling refractive index of an immersion medium 110 in accordance with an aspect of the present invention. The immersion medium 110 occupies the gap between a substrate 120 (e.g., wafer) and a final optical component 130 (e.g., lens). Characteristics of the immersion medium 110 can include low optical absorption at the exposure radiation wavelength, compatibility with resist and lens material, uniformity of properties throughout the immersion medium 110, non-contaminating, etc. According to an aspect of the present invention, the immersion medium 110 can be, for example, water, oil (e.g., perfluorinated polyethers (PFPE) including PFPE-K, PFPE-Y, PFPE-D, PFPE-M, PFPE-Z), etc.

The immersion medium 110 utilized in connection with the present invention has a refractive index (n) greater than the refractive index of air. Refractive index is a ratio of speed of light in a vacuum to speed of light in a particular medium and varies dependent upon radiation wavelength. For example, the refractive index corresponding to 193 nm radiation is approximately 1.4 for water and approximately 1 for air. Furthermore, it is desirable to have a refractive index greater than 1 provided that the immersion medium 110 is 100% transparent to the exposure radiation wavelength. However, the invention is not intended to be limited to a 100% transparent immersion medium 110 with refractive index greater than 1, as various other transparencies are contemplated and intended to fall within the scope of the hereto appended claims.

The immersion medium 110 interacts with a refractive index monitoring component 140 that can monitor and/or control the refractive index of the immersion medium 110. The refractive index monitoring component 140 can derive the refractive index (n) and/or lithographic constant (k) of the immersion medium 110. Additionally, the refractive index monitoring component 140 can control refractive index and/or lithographic constant values of the immersion medium 110. For example, control of refractive index and/or lithographic constant of the immersion medium 110 can be facilitated by means of modifying temperature, altering pressure, flushing the immersion medium from the system and adding new liquid, etc.

Refractive index and/or lithographic constant values can be derived from light scattering of a known grating structure which can be built upon the substrate 120 (e.g., wafer, wafer stage, reticle, . . . ). The substrate 120 thus can be at least partially immersed within the immersion medium 110 and subjected to radiation, which is detected and analyzed to yield values for refractive index and/or lithographic constant. It is to be appreciated that the refractive index monitoring component 140 can be, for example, a scatterometry component. The present invention contemplates any suitable refractive index monitoring component 140 and/or system, and such components and/or systems are intended to fall within the scope of the hereto-appended claims.

Tunable values for refractive index and/or lithographic constant facilitate additional control over resolution of the photolithographic process. The refractive index monitoring component 140 can facilitate change of the characteristics (e.g., refractive index, lithographic constant, . . . ) of the immersion medium 110, thus resulting in control of resolution of the photolithographic process. In particular, the resolution can be defined as:

$$\text{resolution} = k\lambda/NA$$

where k is a lithographic constant, $\lambda$ is an exposure radiation wavelength, and NA is a numerical aperture. Furthermore, the numerical aperture can be derived as follows:

$$NA = n \sin \alpha$$

where n is a refractive index and $2\alpha$ is an angle of acceptance of a lens. Thus, resolution can be increased by increasing refractive index and/or decreasing lithographic constant.

The immersion medium 110 can be a supercritical fluid in gaseous phase or ozone vapor—a supercritical fluid is a fluid that is at a temperature and pressure above a particular medium's critical temperature and critical pressure. While in a supercritical state, pressure can be applied to the medium to effectuate a change in the refractive index and/or lithographic constant of the immersion medium 110.

It is further to be appreciated that information gathered by the refractive index monitoring component 140 can be utilized for generating feedback and/or feed-forward data that can facilitate achieving increased resolution. The system 100 for monitoring and/or controlling refractive indices can additionally employ such data to control components and/or operating parameters associated therewith. For instance, feedback/feed-forward information can be generated in connection with the immersion medium to maintain, increase, or decrease temperature and/or pressure of the immersion medium.

Figure 2:
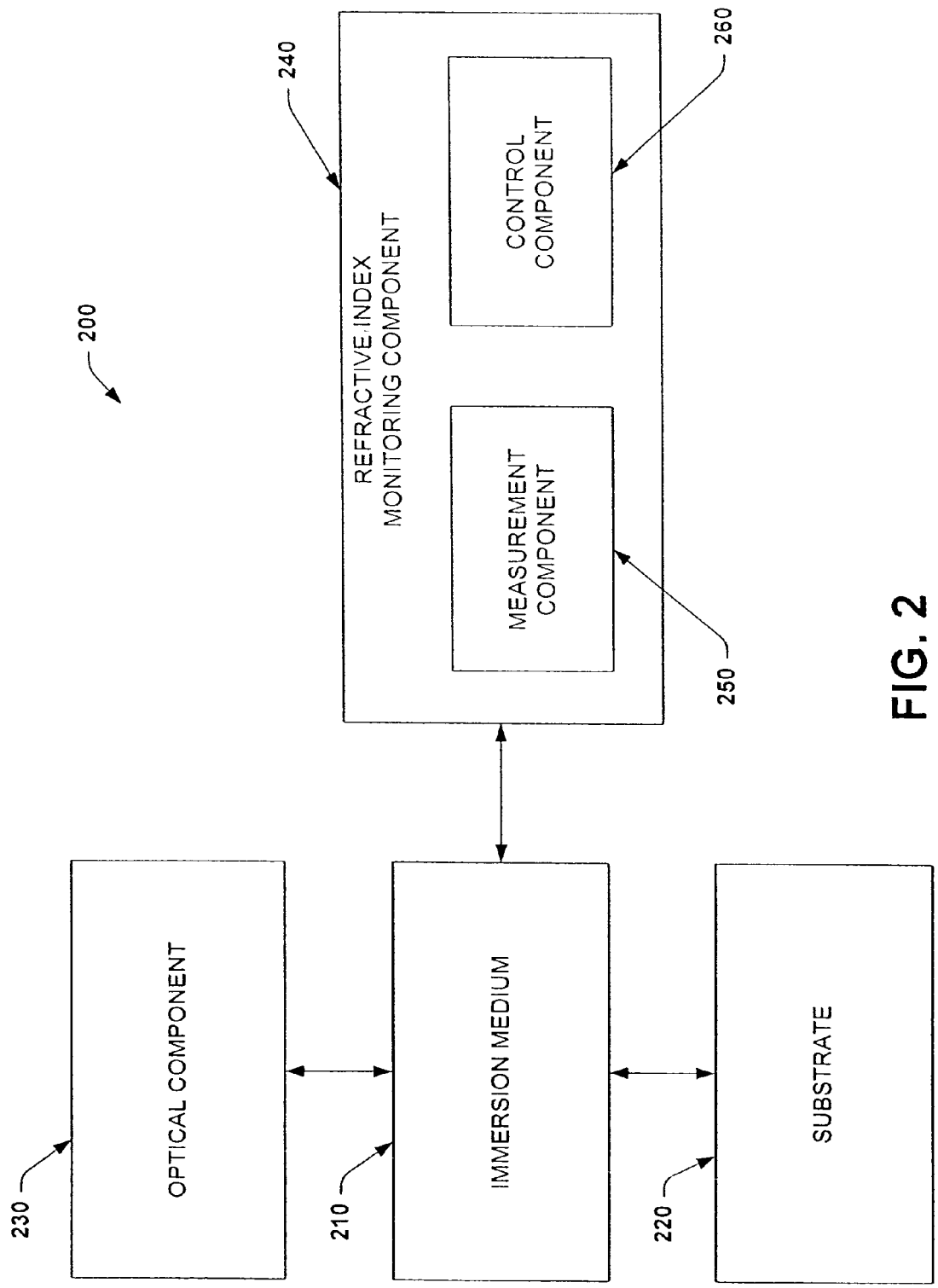
FIG. 2 is an illustration of a system for measuring and/or controlling refractive index of an immersion medium in accordance with an aspect of the present invention.

FIG. 2 illustrates another example of a system 200 for measuring and/or controlling refractive index of an immersion medium 210 in accordance with an aspect of the present invention. The system comprises an immersion medium 210 which can possess a refractive index greater than 1, which facilitates lowering effective wavelength of exposure radiation propagating within the immersion medium 210. For example, the immersion medium 210 can be water, supercritical fluid in gaseous phase, ozone vapor, etc. An optical component 230, such as a lens, can be employed to emit light to a substrate 220 (e.g., a wafer) via the immersion medium 210, thereby effectuating a particular semiconductor fabrication process such as wafer etching. The immersion medium 210 is further operatively coupled to a refractive index monitoring component 240. The refractive index monitoring component 240 comprises a measurement component 250 and a control component 260.

The measurement component 250 can determine refractive index (n) and/or lithography constant (k) values of the immersion medium 210. The measurement component 250, for example, can include a light source that emits an incident beam onto a substrate 220 (e.g., wafer, wafer stage, reticle, . . . ), which has a known grating structure. When the beam is emitted, it interacts with the substrate 220 and the immersion medium 210 and is diffracted and/or reflected. The measurement component 250 can also include a detection system, such as a spectrometer, for detecting the reflected and/or diffracted beam from the substrate 220 and immersion medium 210. Characteristics of the immersion medium 210 are determined based on properties of the reflected and/or diffracted beam and the known grating structure. Those skilled in the art will understand and appreciate various other non-destructive optical measurement techniques that could be utilized.

The control component 260 can be operatively coupled to the immersion medium 210 and to the measurement component 250. The control component 260 is programmed and/or configured to control operation of the measurement component 250 and characteristics of the immersion medium 210 in accordance with an aspect of the present invention.

According to one particular aspect of the present invention, the control system 260 can control the measurement component 250 so that the incident beam selectively interrogates an immersion medium 210 and a known grating structure on a substrate 220. For example, the incident beam can be emitted to selectively interrogate the immersion medium 210 when the substrate 220 with the known grating structure is at least partially within the immersion medium 210.

Alternatively or additionally, the control component 260 can control immersion medium 210 characteristics such as refractive index and/or lithographic constant. The control component 260 can effectuate a change in characteristics of the immersion medium 210 by varying temperature, pressure, flushing immersion medium, etc. The control system 260 can utilize measured characteristic data of the immersion medium 210 to appropriately control changes of characteristics of the immersion medium 210 to facilitate optimization of the immersion lithography process.

Figure 3:
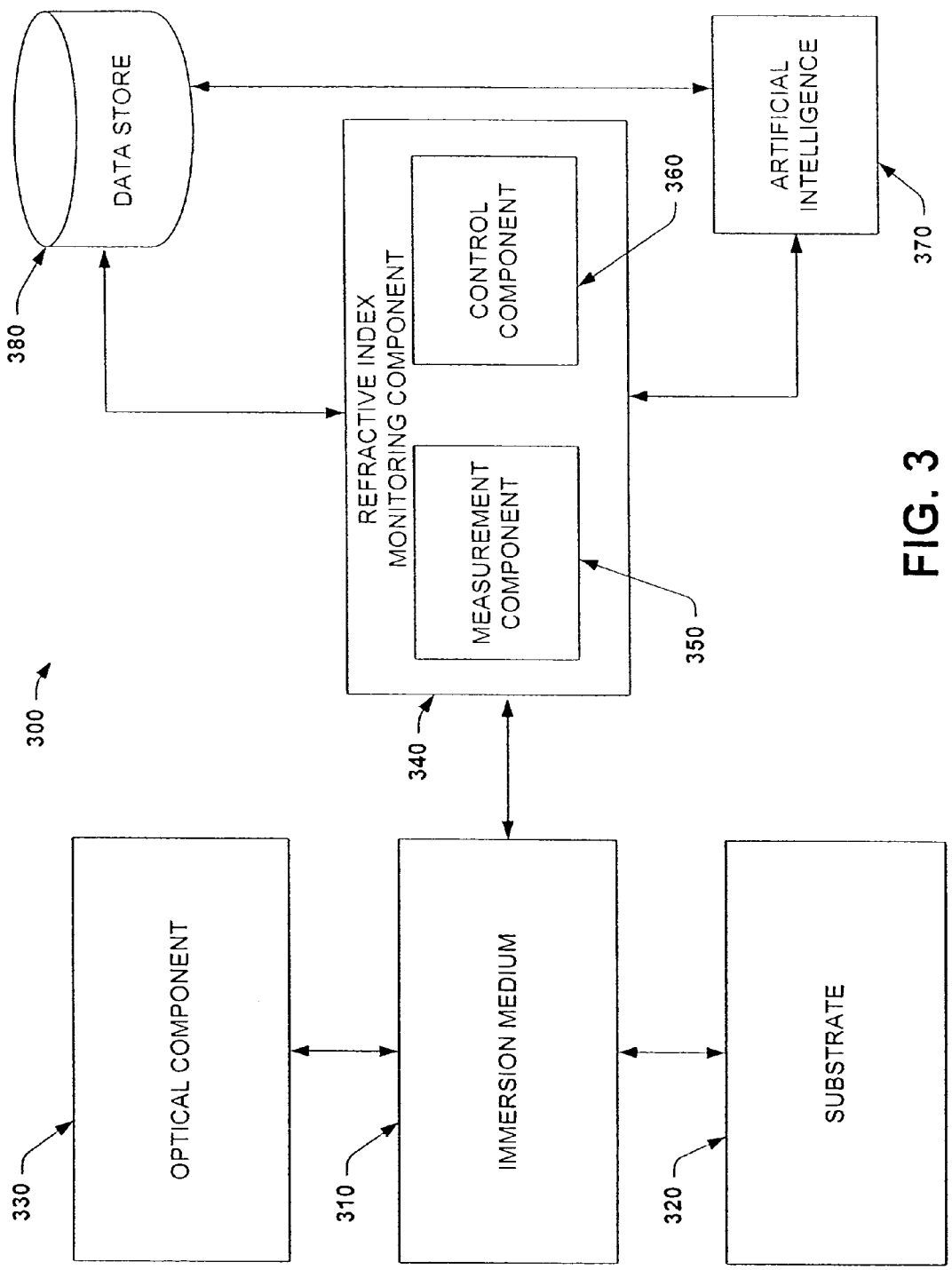
FIG. 3 is an illustration of a system for measuring and/or controlling refractive index of an immersion medium in accordance with an aspect of the present invention.

FIG. 3 illustrates another example of a system 300 for measuring and/or controlling refractive index of an immersion medium 310 in accordance with an aspect of the present invention. The refractive index measuring and/or controlling system 300 can employ various inference schemes and/or techniques in connection with measuring and controlling refractive index of the immersion medium 310. As used herein, the term "inference" refers generally to the process of reasoning about or inferring states of the system, environment, and/or user from a set of observations as captured via events and/or data. Inference can be employed to identify a specific context or action, or can generate a probability distribution over states, for example. The inference can be probabilistic—that is, the computation of a probability distribution over states of interest based on a consideration of data and events. Inference can also refer to techniques employed for composing higher-level events from a set of events and/or data. Such inference results in the construction of new events or actions from a set of observed events and/or stored event data, whether or not the events are correlated in close temporal proximity, and whether the events and data come from one or several event and data sources. Various classification schemes and/or systems (e.g., support vector machines, neural networks, expert systems, Bayesian belief networks, fuzzy logic, data fusion engines . . . ) can be employed in connection with performing automatic and/or inferred action in connection with the subject invention.

Still referring to FIG. 3, a refractive index measuring and/or controlling system 300 comprises an immersion medium 310 (e.g., water, oil, supercritical fluid in gaseous state, ozone vapor, . . . ) that can possess a refractive index greater than 1, which facilitates lowering effective wavelength of exposure radiation. An optical component 330, such as a lens, can be employed to emit light to a substrate 320 (e.g., a wafer) via the immersion medium 310, thereby effectuating a particular semiconductor fabrication process such as wafer etching. A refractive index monitoring component 340 is operatively coupled to the immersion medium 310, comprising a measurement component 350 and a control component 360. The refractive index monitoring component 340 can be operatively coupled to an artificial intelligence (AI) component 370 that is capable of making inferences regarding system operation and a data store 380 that can store data corresponding to known grating structures on substrates 320, prior immersion medium 310 characteristics, previous changes to the immersion medium 310 by means of change in temperature, pressure, etc. Additionally, the AI component 370 can be operatively coupled to the data store 380. According to an aspect of the present invention, the AI component 370 can determine optimal changes to the immersion medium 310 which can be effectuated by the control component 360. Furthermore, the AI component 370 and/or refractive index monitoring component 340 can store and retrieve data from the data store 380 corresponding to the immersion medium 310 such as, for example, refractive index values, lithographic constant values, temperatures, pressures, changes implemented to immersion medium, etc. These examples are given by way of illustration only and are not in any way intended to limit the scope of the present invention or the number of, or manner in which the AI component 370 makes inferences.

Figure 4:
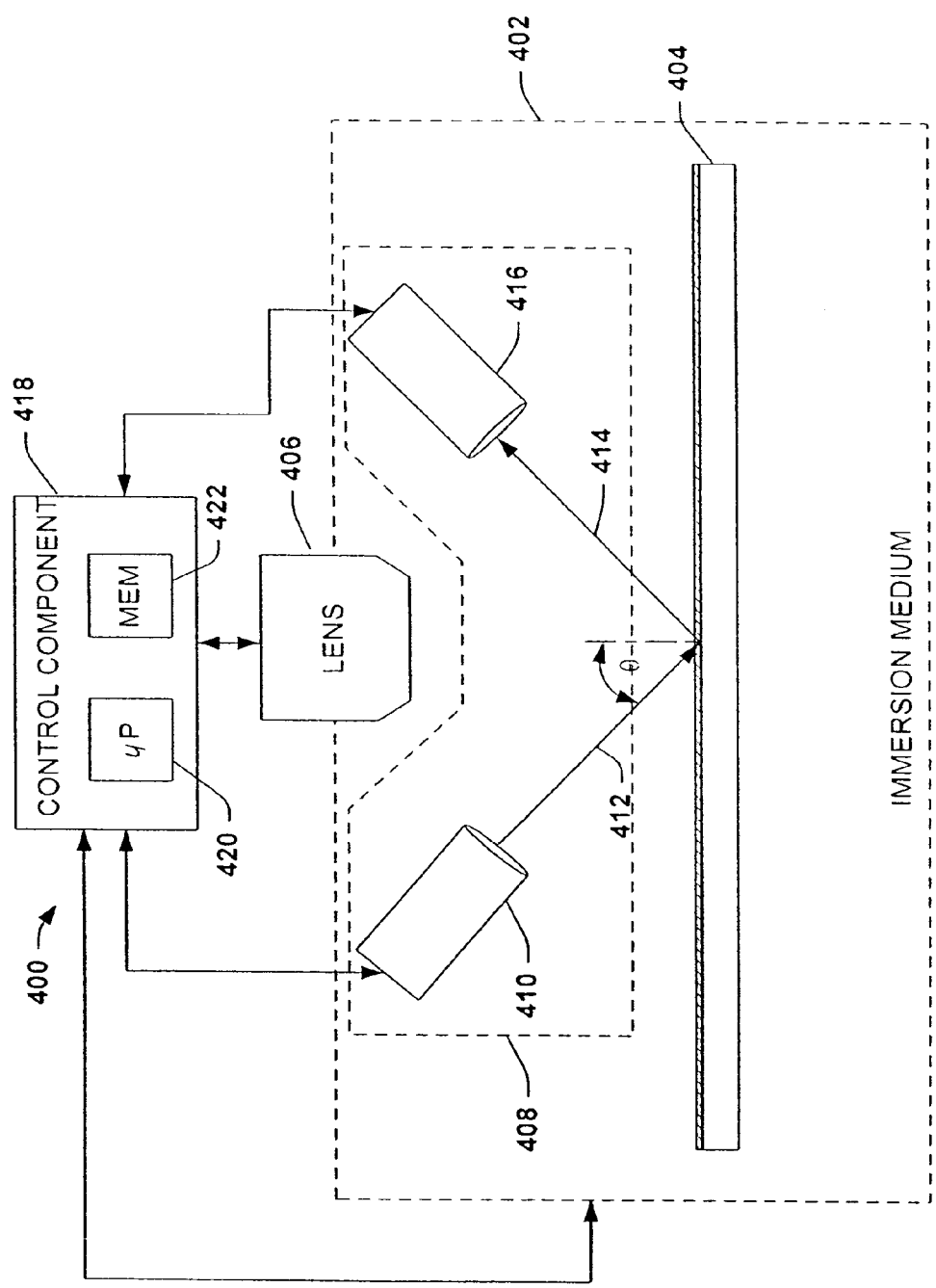
FIG. 4 is a schematic block diagram of an exemplary refractive index monitoring system in accordance with an aspect of the present invention.

FIG. 4 illustrates another example of a system 400 for measuring and/or controlling refractive index of an immersion medium 402 in accordance with an aspect of the present invention. In this example, a substrate 404 (e.g., wafer, wafer stage, reticle, . . . ) with a known grating structure is at least partially within an immersion medium 402 (e.g., water, supercritical fluid in gaseous state, ozone vapor, . . . ). Additionally, a final optical component, such as a lens 406, is also at least partially within the immersion medium 402. The system can also utilize a measuring system 408 for measuring features of the immersion medium 402 in accordance with an aspect of the present invention. By way of illustration, the measuring system 408 is a non-destructive measurement tool that includes a source of light 410, such as one or more optical emitters, for emitting an incident light beam 412 toward the substrate 404 at an incident angle θ relative to a normal reference line. The light source 410 can be a frequency stabilized laser; however it will be appreciated by one skilled in the alt that any laser or other suitable light source (e.g., laser diode, or helium neon (HeNe) gas laser, halogen lamp, etc.) can be utilized in connection with the present invention.

At least a portion of the incident beam 412 is reflected and/or diffracted as a reflected beam 414. One or more optical detectors 416 receive(s) the reflected and/or diffracted beam 414. The detector(s) 416 analyze characteristics of the reflected beam 414 and can be operative to discern optical properties of the beam. As described below, the optical properties of the beam describe optical characteristics of the known grating structure built on the substrate 404 and the immersion medium 402, which facilitates deriving characteristics of the immersion medium 402. The immersion medium 402 characteristics, for example, can include refractive index and lithographic constant.

By way of example, the detector 416 can include a spectrometer or any instrument capable of providing spectrally-resolved information concerning the reflected beam 414. The portion of the reflected beam 414 that enters the detector 416 for analysis is determined by such portion and its associated diffraction characteristics, the special extent of the reflected beam 414, properties of the detector 416, and any associated optical elements that might be used in conjunction with the detector 416.

The detector 416 collects light reflected and/or passed through one or more gratings and/or features built upon the substrate 404 and the immersion medium 402. The measurement system 408 can extract information regarding the characteristics of the immersion medium 402 by comparing phase and/or intensity of the incident beam 412 with phase and/or intensity signals of a complex reflected and/or diffracted light associated with the reflected beam 414. The substrate 404 has a known grating structure constructed upon it which allows for deriving characteristics of the immersion medium 402. The intensity and/or the phase of the reflected and/or diffracted light changes based on properties of the immersion medium 402.

The system can further comprise a control component 418. According to one aspect of the present invention, the control component 418 can be operatively coupled to the lens 406, measurement system 408 and the immersion medium 402. The control component 418 can facilitate operation of the measurement system 408. Additionally, the control component 418 can effectuate changes in temperature, pressure, etc. of the immersion medium 402 to change refractive index and/or lithographic constant values based at least in part upon measurements obtained by the measuring system 408. Moreover, the control component 418 can further utilize such measurements to control operation of optical components such as, for example, the lens 406. Control of the lens 406 facilitates control over an exposure germane to a photolithographic process.

According to this aspect, a control component 418 further comprises a processor 420 and memory 422. It is to be understood that the processor 420 can be a processor dedicated to determining refractive index and/or lithographic constant values of the immersion medium 402, a processor used to control the immersion medium 402 thereby tuning the refractive index and/or lithographic constant values, or, alternatively, a processor that is both used to determine refractive index and/or lithographic constant values and to control tuning of the values.

The memory 422 stores program code executed by the processor 420 for carrying out operating functions of the system. The memory 422 also serves as a storage medium for temporarily storing information, such as refractive index, lithographic constant, temperature, pressure, etc. that can be employed in carrying out the present invention. The memory 422 can be either volatile memory or nonvolatile memory, or can comprise both volatile and nonvolatile memory. By way of illustration, and not limitation, nonvolatile memory can comprise read only memory (ROM), programmable ROM (PROM), electrically programmable ROM (EPROM), electrically erasable ROM (EEPROM), or flash memory. Volatile memory can comprise random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM). The memory of the present systems and methods is intended to comprise, without being limited to, these and any other suitable types of memory.

Figure 5:
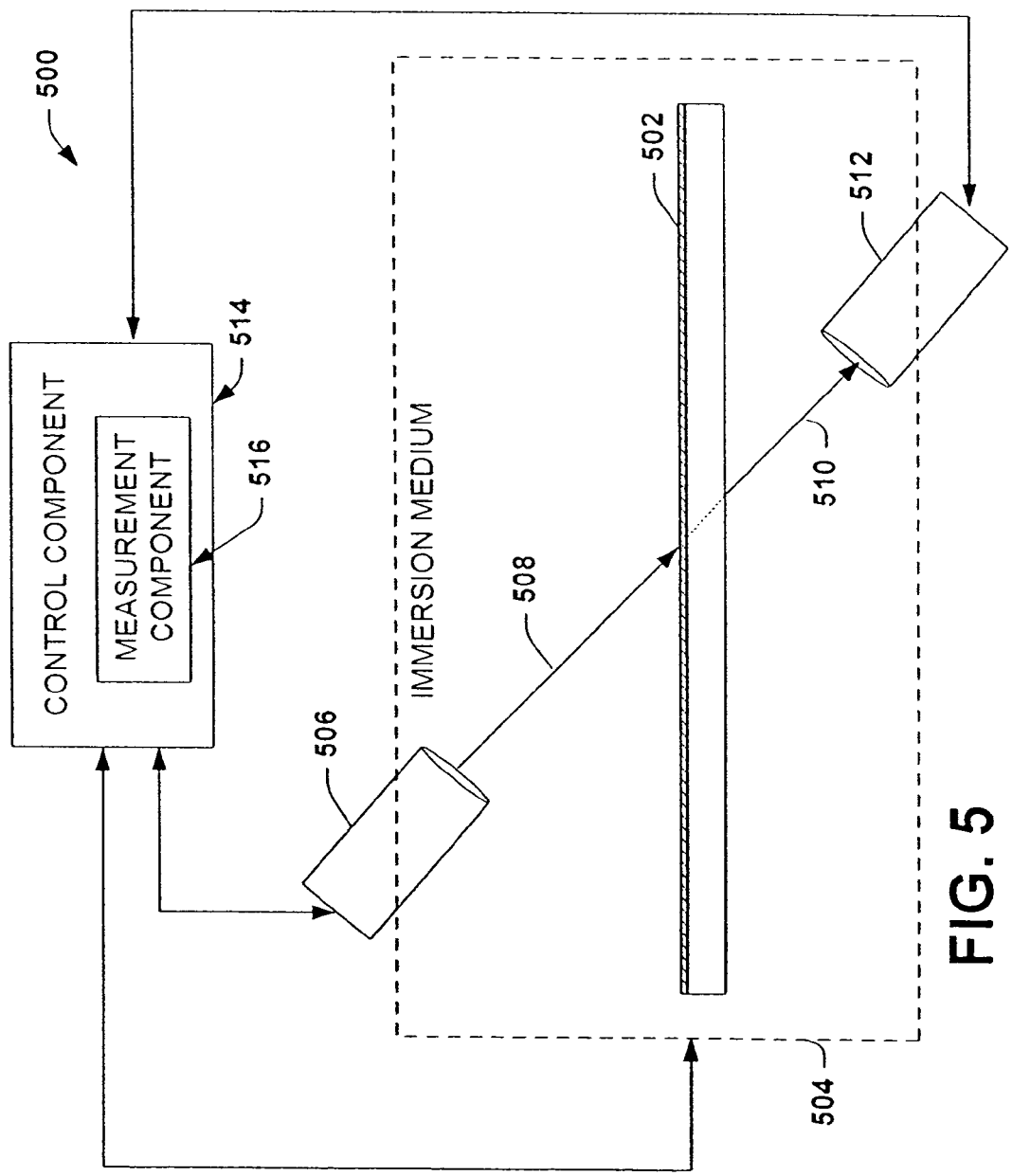
FIG. 5 is a schematic block diagram of an exemplary refractive index monitoring system in accordance with an aspect of the present invention.

FIG. 5 illustrates an arrangement that is similar in function to FIG. 4, and which accommodates substrates that are partially or fully transparent. The substrate 502 is at least partially within the immersion medium 504. In this example, a light source 506 provides an incident beam 508, at least a portion of which is transmitted through the substrate 502 and immersion medium 504. A diffracted and/or refracted beam 510 exits a side of the substrate 502 opposite to that of the incident beam 508. At least a portion of the diffracted beam enters a detector 512, such as a spectrometer, which can be processed using known scatterometry techniques as described herein.

By way of example, a control component 514, which is operatively coupled to the light source 506, the detector 512, and the immersion medium 504, is programmed and/or configured to control operation and/or characteristics of such components. In particular, the control component 514 includes a measurement component 516 programmed and/or configured to control operation of the light source 506 and the detector 512. As indicated below, the measurement component 516 also is programmed to determine characteristics of the immersion medium 504 based on optical data obtained by the detector 512 (e.g., spectrometer) based on the beam 510 and a known grating structure upon the substrate 502. For example, the measurement component 516 can be utilized to obtain refractive index and/or lithographic constant values of the immersion medium 504.

The control component 514 also is programmed and/or configured to control characteristics of the immersion medium 504. The control component 514 can control temperature, pressure, exchange immersion medium, etc. to effectuate a change in characteristics of the immersion medium 504. Such characteristic changes can include, for example, varying refractive index, lithographic constant, etc.

Alternatively or additionally, the control component 514 can control characteristics of the immersion medium 504 based at least in part on measured characteristics of the immersion medium 504 obtained via the measurement component 516. In this way, operation of the measuring component 516 and the immersion medium 504 can be synchronized to facilitate tunable refractive index and lithographic constant values of the immersion medium 504, which thus accommodate increased resolution.

Figure 6:
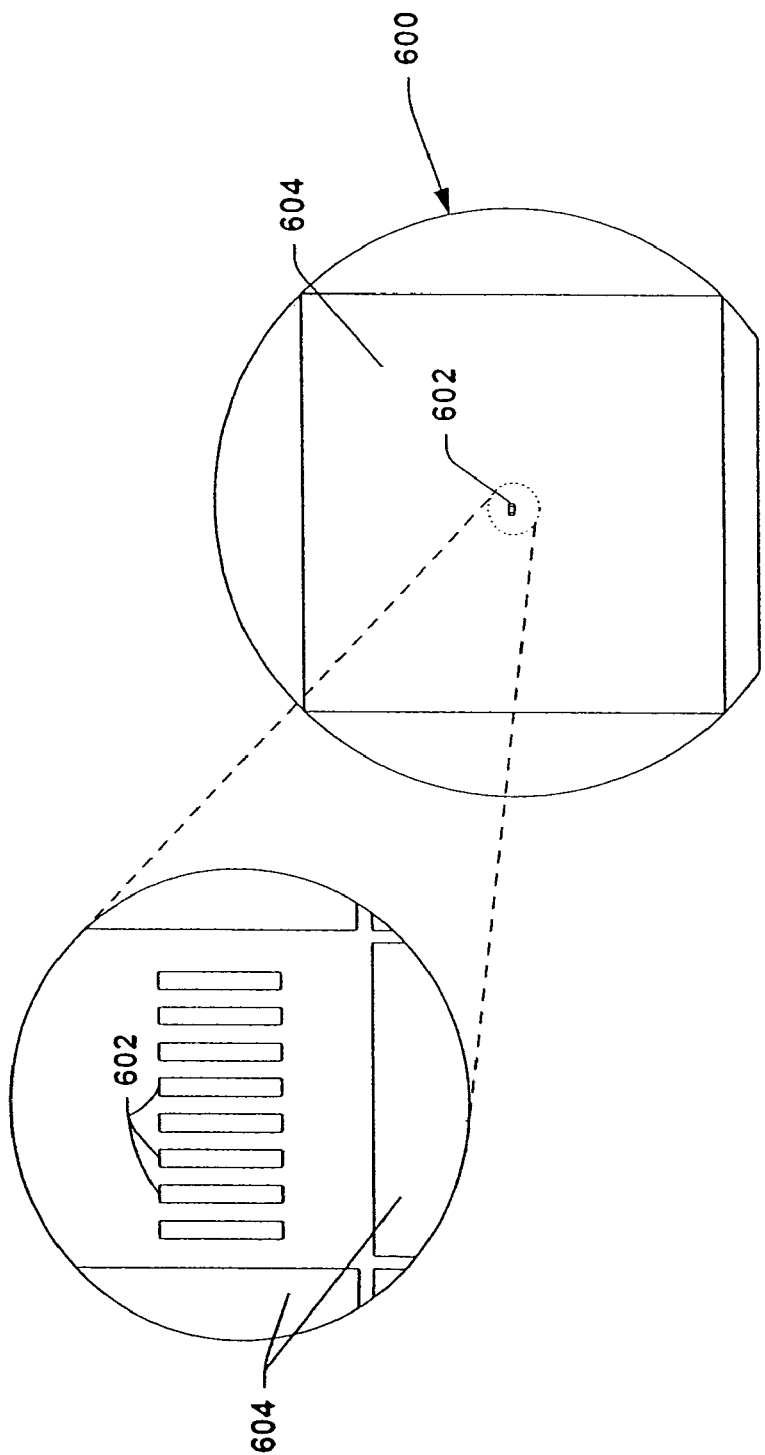
FIG. 6 is an illustration of a substrate in accordance with an aspect of the present invention.

Referring to FIG. 6, an example of a substrate 600 (e.g., wafer, wafer stage) such as can be utilized in connection with immersion lithography is illustrated for use in accordance with an aspect of the present invention. Gratings 602 are located near a central region of the substrate 600 to facilitate inspection and/or measurement of an immersion medium. The gratings 602 can be located between production regions of the substrate 604 so as to maximize real estate associated with the substrate 600 being manufactured. Alternatively, the gratings 602 can be located upon a wafer stage and/or a wafer not subject to production. The particular grating 602 illustrated in FIG. 6 is a series of elongated parallel marks, which can be implemented as raised portions in the substrate or as troughs, such as etched into the substrate 600. It is to be appreciated that more complex (e.g., nonlinear) grating patterns and/or substrate features (e.g., lines, connectors, . . . ) also could be used in accordance with an aspect of the present invention. A known grating structure can be employed in connection with the present invention and thus can facilitate deriving characteristics of an immersion medium by utilizing measurement techniques associated with the combination of substrate 600 and immersion medium.

Figure 7:
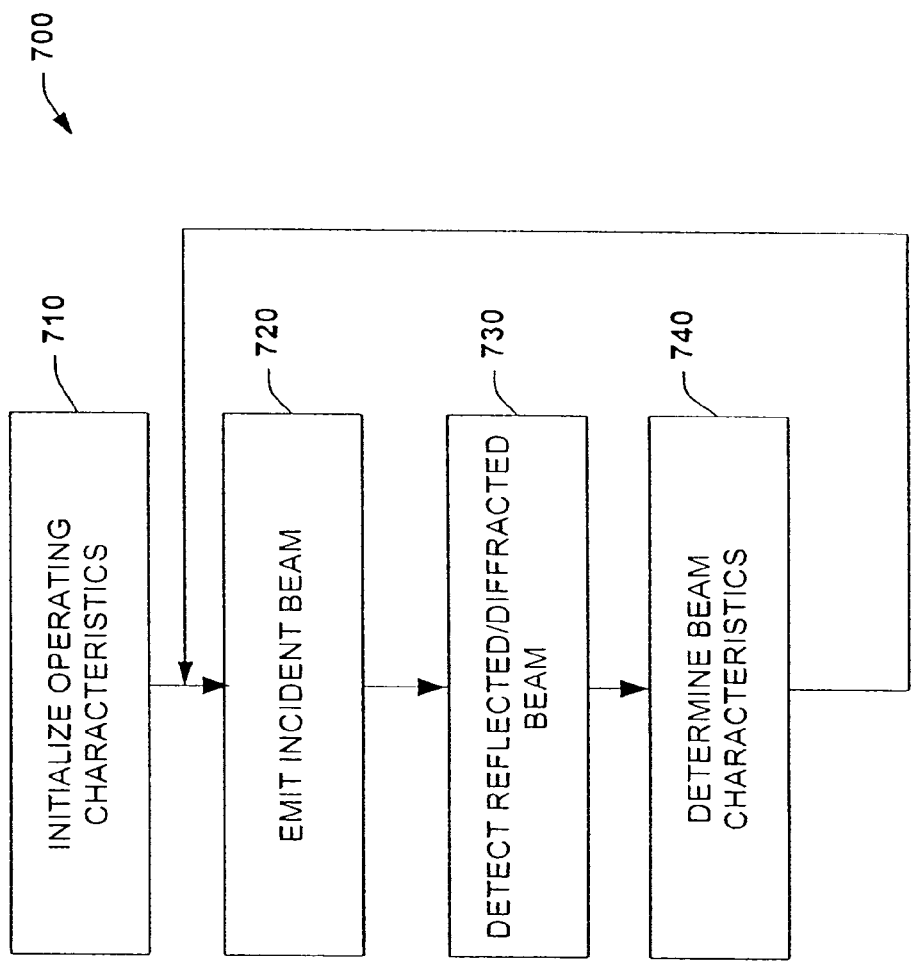
FIG. 7 is a flow diagram of a refractive index monitoring and/or measuring methodology in accordance with an aspect of the present invention.
Figure 8:
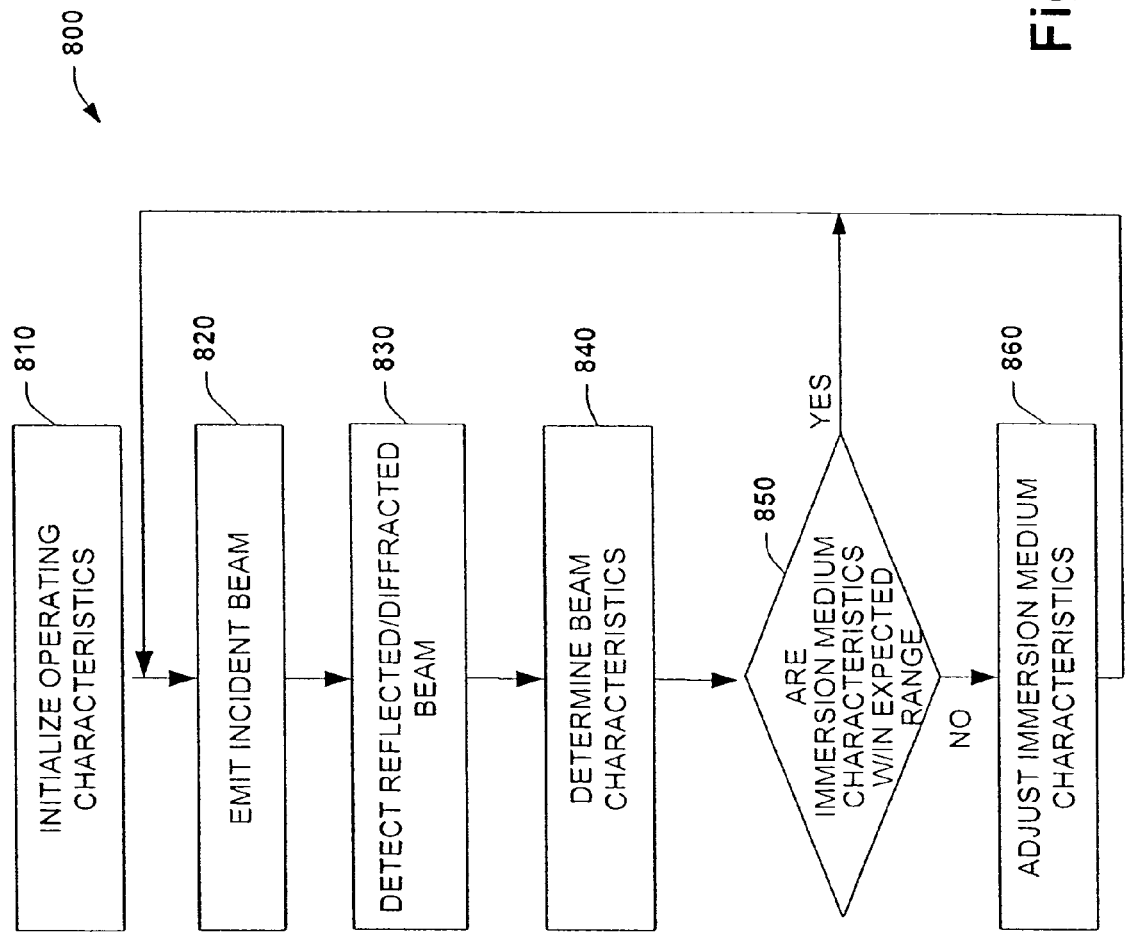
FIG. 8 is a flow diagram of a refractive index monitoring and/or measuring methodology in accordance with an aspect of the present invention.

In view of the exemplary systems shown and described above, methodologies 700 and 800, which may be implemented in accordance with the present invention, will be better appreciated with reference to the flow diagrams of FIG. 7 and FIG. 8. While, for purposes of simplicity of explanation, the methodologies 700 and 800 are shown and described as a series of function blocks, it is to be understood and appreciated that the present invention is not limited by the order of the blocks, as some blocks may, in accordance with the present invention, occur in different orders and/or concurrently with other blocks from that shown and described herein. Moreover, not all illustrated blocks may be required to implement a methodology in accordance with the present invention. It is to be appreciated that the various blocks may be implemented via software, hardware a combination thereof or any suitable means (e.g., device, system, process, component) for carrying out the functionality associated with the blocks. It is also to be appreciated that the blocks are merely to illustrate certain aspects of the present invention in a simplified form and that these aspects may be illustrated via a lesser and/or greater number of blocks.

Turning to FIG. 7, the methodology 700 initializes operating characteristics to their starting values at 710. This can include, for example, placing a substrate with a known grating structure at least partially into the immersion medium and/or setting initial optical parameters of an incident beam for measuring topographical characteristics of the substrate in accordance with an aspect of the present invention.

At 720, an incident beam is emitted. The incident beam, for example, is emitted so as to interrogate a known grating structure upon a substrate and/or the immersion medium. The known grating structure can be, for example, substantially parallel lines built upon a substrate. At 730, a diffracted and/or reflected beam produced from the incident beam interacting with the substrate and immersion medium is detected. The reflected and/or diffracted beam, for example, is collected by a spectrometer or other optical detection device capable of detecting properties of the reflected and/or diffracted beam. The reflected and/or diffracted beam contains useful, quantifiable information indicative of optical characteristics of the substrate and immersion medium.

At 740, optical properties and characteristics of the reflected and/or diffracted beam are determined. The optical properties, for example, can include wavelength(s) and intensity of light, refractive indices, polarization state, etc. of the reflected and/or diffracted beam. The optical properties can be employed with known grating structures build upon a substrate to derive characteristics of the immersion medium (e.g., refractive index, lithographic constant, . . . ).

From 740, the process returns to 720 where the foregoing methodology is repeated, such as for a time while the substrate with the known grating structure is within the immersion medium. The determined characteristics of the immersion medium can, in turn, be utilized to adjust temperature, pressure, etc. of the immersion medium, thus adjusting properties of the immersion medium.

FIG. 8 is a flow diagram illustrating another methodology 800 for carrying out the present invention. At 810 the operating characteristics are initialized to their starting values. This can include, for example, placing a substrate with a known grating structure at least partially into the immersion medium and/or setting initial optical parameters of an incident beam for measuring topographical characteristics of the substrate in accordance with an aspect of the present invention.

At 820, an incident beam is emitted. The incident beam, for example, is emitted as to interrogate an immersion medium and/or a substrate (e.g., wafer, wafer stage, . . . ). A known grating structure built upon the substrate. The incident beam is reflected and/or diffracted to produce a beam having characteristics indicative of substrate and/or immersion medium properties illuminated by the incident beam.

At 830, the reflected and/or diffracted beam is detected, such as using a spectrometer, although other optical detection techniques capable of detecting the reflected and/or diffracted beam could be used. At 840, optical characteristics of the reflected and/or diffracted beam, such as intensity of one or more wavelengths of the detected light, phase characteristics, refractive indices, polarization state, etc., are determined. The optical characteristics can be employed to derive an indication of immersion medium parameters, such as refractive index and lithographic constant.

At 850, a determination is made as to whether the immersion medium characteristics are within an expected range. If the immersion medium characteristics are within an expected range of parameters, the process returns to 820 and the foregoing methodology is repeated. If the determination 850 is negative, indicating that immersion medium characteristics are outside the expected range, the process proceeds to 860. At 860, immersion medium characteristics are adjusted by means of temperature change, pressure change, flushing immersion medium, etc.

From 860, the present iteration ends and the process returns to 820, in which the methodology continues, as described above such as for a duration commensurate with the associated fabrication process. As a result, the present invention facilitates controlling refractive index and lithographic constant of an immersion medium at a fixed exposure wavelength, and thus increases resolution.

Turning now to FIGS. 9–11, in accordance with one or more aspects of the present invention, a wafer 902 situated on a stage 904 can be logically partitioned into grid blocks. Each grid block (XY) of the grid pattern corresponds to a particular portion of the wafer 902, and each grid block has a known grating structure associated with that grid block. Each portion is monitored individually for signatures generated by the known grating structure and a portion of an immersion medium.

In FIG. 10, one or more portions of the immersion medium and the known grating structures in respective portions of the wafer 902 ($X_1Y_1$ . . . $X_{12}$, $Y_{12}$) are being monitored for signatures using reflective and/or passed through light, a signature system and a processor. It is to be appreciated that although FIG. 10 illustrates the wafer 902 being mapped (partitioned) into 144 grid block portions, the wafer 902 may be mapped with any suitable number of portions and any suitable number of gratings may be employed. Given the set of recorded signatures, a processor can determine that an undesirable immersion medium characteristic (e.g., refractive index, lithographic constant) exists. Similarly, a processor may generate feed forward information which can facilitate maintaining, terminating, and/or adjusting conditions associated with the immersion medium such as, for example temperature, pressure, etc.

FIG. 11 illustrates a table of expected and unexpected signatures. It can be seen that all the signatures are expected except a signature for grid $X_7Y_6$. The set of depicted signatures can be analyzed collectively as a master signature and/or can be analyzed in subsets to evaluate, for example, refractive index and lithographic constant values. The analysis of the signatures can be employed to control characteristics of the immersion medium such as, for example refractive index and/or lithographic constant. Furthermore, temperature, pressure, etc. can be monitored and/or controlled in connection with the grid blocks.

Scatterometry is a technique for extracting information about a surface upon which an incident light has been directed. Information concerning properties including, but not limited to, dishing, erosion, profile, chemical composition, thickness of thin films and critical dimensions of features present on a surface such as a wafer can be extracted. Furthermore, information about an immersion medium such as refractive index and lithographic constant can be extracted by utilizing scatterometry techniques. The information can be extracted by comparing the phase and/or intensity of the light directed onto the surface with phase and/or intensity signals of a complex reflected and/or diffracted light resulting from the incident light reflecting from and/or diffracting through the surface upon which the incident light was directed. The intensity and/or the phase of the reflected and/or diffracted light will change based on properties of the surface upon which the light is directed and the immersion medium which the light travels through. Such properties include, but are not limited to, the chemical properties of the surface, the planarity of the surface, features on the surface, voids in the surface, and the number, type of layers beneath the surface, refractive index of the medium, lithographic constant of the medium.

Different combinations of the above-mentioned properties will have different effects on the phase and/or intensity of the incident light resulting in substantially unique intensity/phase signatures in the complex reflected and/or diffracted light. Thus, by examining a signal (signature) library of intensity/phase signatures, a determination can be made concerning the properties of the immersion medium utilized in connection with a known grating structure on the surface. Such substantially unique phase/intensity signatures are produced by light reflected from and/or refracted by different surfaces and/or immersion mediums due, at least in part, to the complex index of refraction of the surface onto which the light is directed. The complex index of refraction (N) can be computed by examining the index of refraction (n) of the surface and an extinction coefficient (k). One such computation of the complex index of refraction can be described by the equation:

$$N=n-jk$$

where j is an imaginary number.

The signal (signature) library can be constructed from observed intensity/phase signatures and/or signatures generated by modeling and simulation. By way of illustration, when exposed to a first incident light of known intensity, wavelength and phase, a first feature on a wafer or of an immersion medium can generate a first phase/intensity signature. Similarly, when exposed to the first incident light of known intensity, wavelength and phase, a second feature on a wafer or of an immersion medium can generate a second phase/intensity signature. For example, a line of a first width may generate a first signature while a line of a second width may generate a second signature. Observed signatures can be combined with simulated and modeled signatures to form the signal (signature) library. Simulation and modeling can be employed to produce signatures against which measured phase/intensity signatures can be matched. In one exemplary aspect of the present invention, simulation, modeling and observed signatures are stored in a signal (signature) library containing over three hundred thousand phase/intensity signatures. Thus, when the phase/intensity signals are received from scatterometry detecting components, the phase/intensity signals can be pattern matched, for example, to the library of signals to determine whether the signals correspond to a stored signature.

Figure 12:
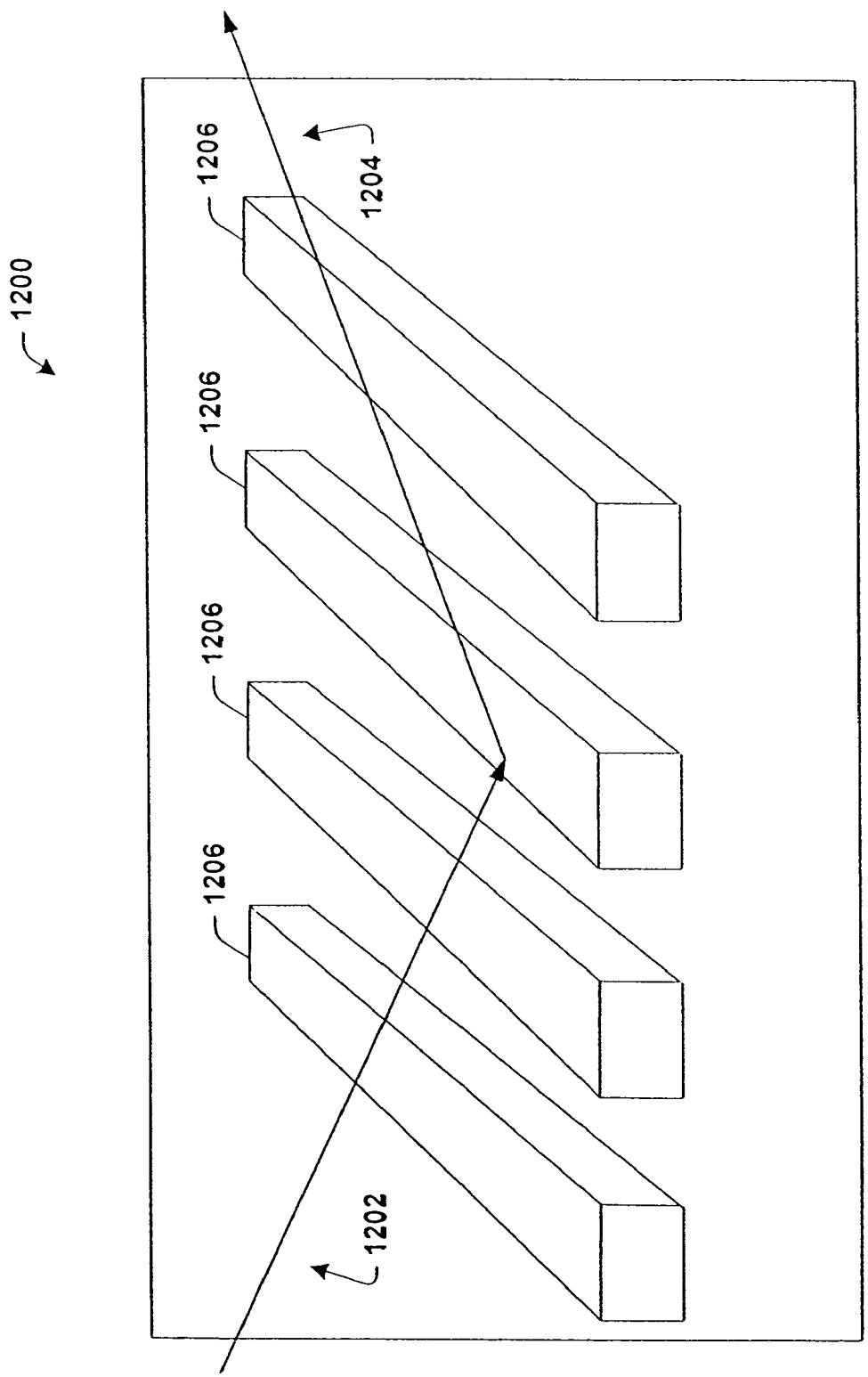
FIG. 12 is a simplified perspective view of an incident light reflecting off a surface in accordance with one or more aspects of the present invention.
Figure 17:
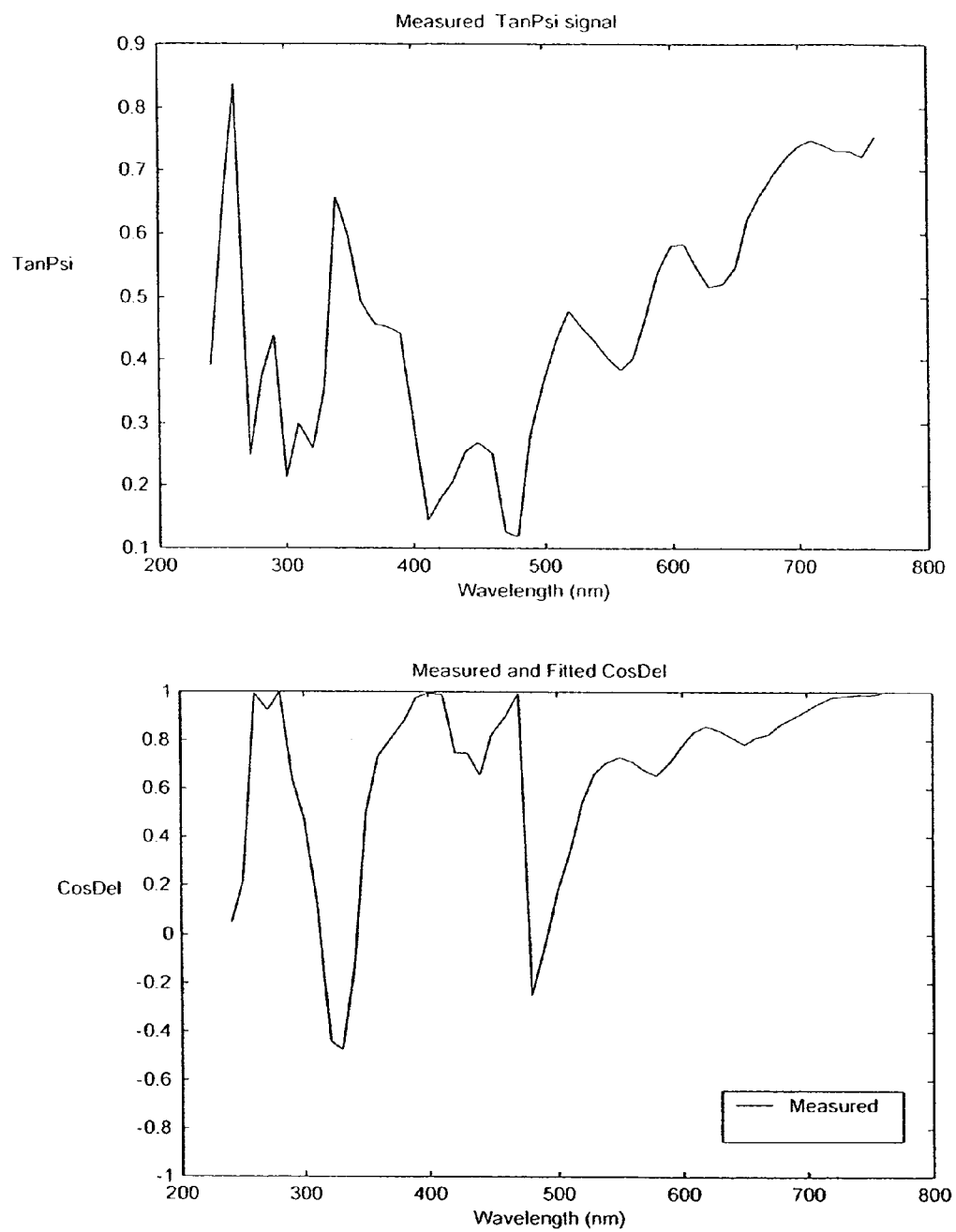
FIG. 17 is an illustration of phase and/or intensity signals recorded from a complex reflected and refracted light produced when an incident light is directed onto a surface in accordance with one or more aspects of the present invention.

To illustrate the principles described above, reference is now made to FIGS. 12 through 17. Referring initially to FIG. 12, an incident light 1202 is directed at a surface 1200, upon which one or more features 1206 may exist. In FIG. 12 the incident light 1202 is reflected as reflected light 1204. The incident light 1202 and/or reflected light 1204 can propagate through an immersion medium (not shown). The properties of the surface 1200, including but not limited to, thickness, uniformity, planarity, chemical composition and the presence of features, can affect the reflected light 1204. Furthermore, properties of the immersion medium can include, for example, refractive index and lithographic constant. In FIG. 12, the features 1206 are raised upon the surface 1200. The phase and intensity of the reflected light 1204 can be measured and plotted, as shown, for example, in FIG. 17. The phase of the reflected light 1204 can be plotted, as can the intensity of the reflected light 1204. Such plots can be employed in connection with known grating structures built upon the surface to compare measured signals with signatures stored in a signature library using techniques like pattern matching, for example.

Figure 13:
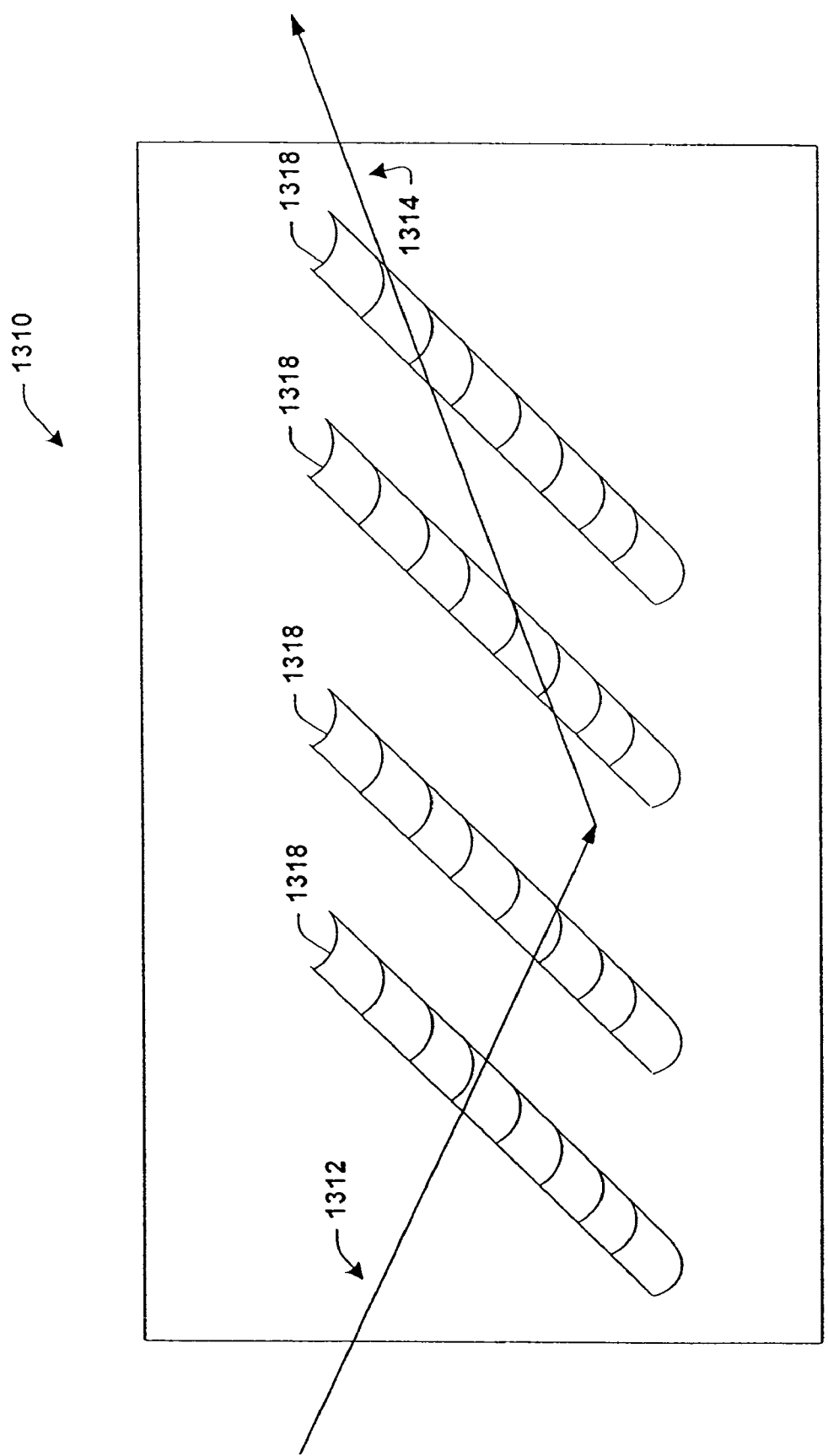
FIG. 13 is a simplified perspective view of an incident light reflecting off a surface in accordance with one or more aspects of the present invention.

Referring now to FIG. 13, an incident light 1312 is directed onto a surface 1310 upon which one or more depressions 1316 appear. The incident light 1312 is reflected as reflected light 1314. The incident light 1312 and/or reflected light can propagate through an immersion medium (not shown). Like the one or more features 1206 (FIG. 12) may affect an incident beam, so too may the one or more depressions 1216 affect an incident beam. Thus, it is to be appreciated that scatterometry can be employed to measure features appearing on a surface, features appearing in a surface, and properties of a surface itself, regardless of features. Additionally, scatterometry can be utilized to measure features of the immersion medium, which can be derived by employing a surface with a known grating structure.

Figure 14:
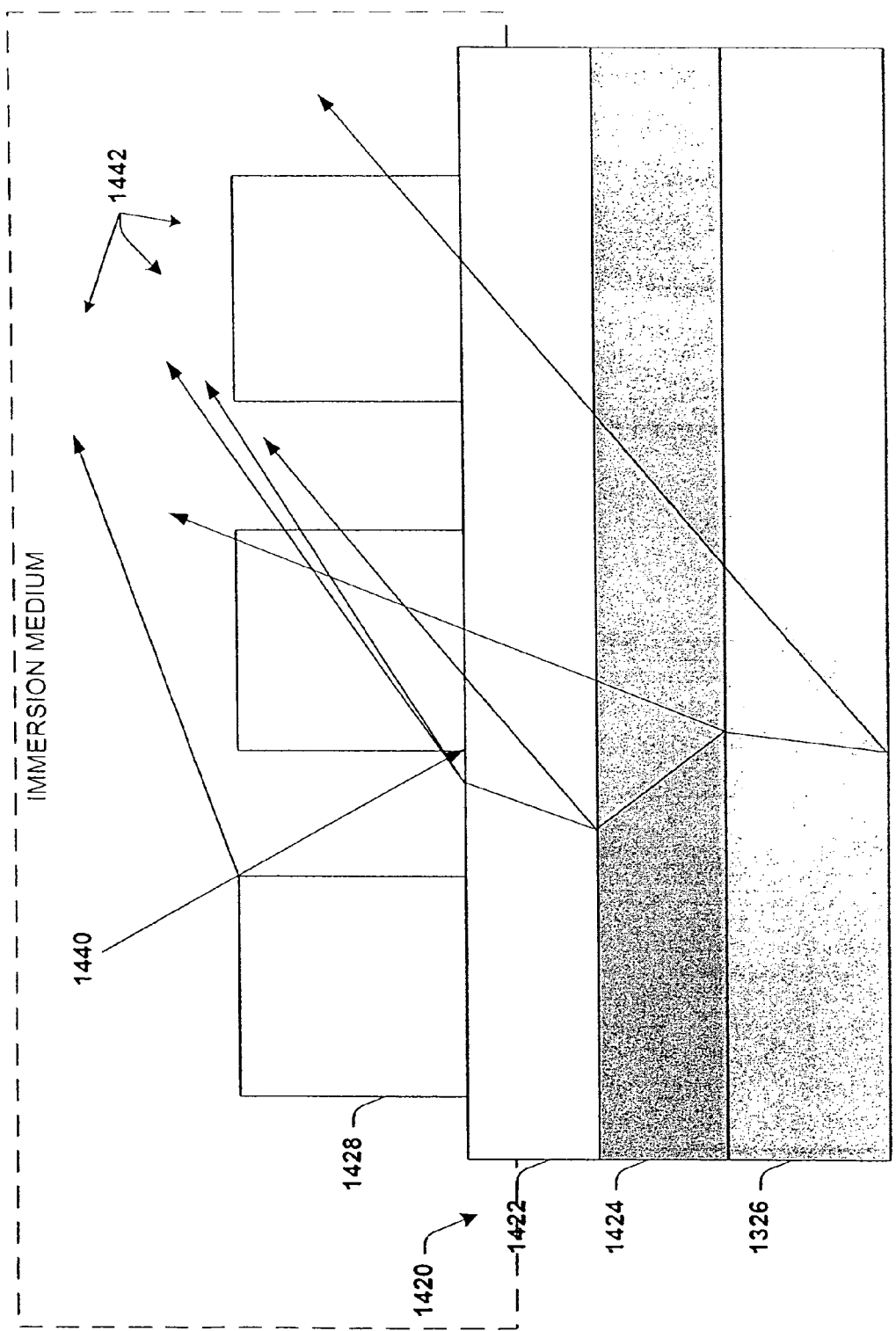
FIG. 14 is an illustration of a complex reflected and refracted light produced when an incident light is directed onto a surface in accordance with one or more aspects of the present invention.

Turning now to FIG. 14, complex reflections and refractions of an incident light 1440 are illustrated. The reflection and refraction of the incident light 1440 can be affected by factors including, but not limited to, the presence of one or more features 1428, the composition of the substrate 1420 upon which the features 1428 reside and characteristics of an immersion medium. For example, properties of the substrate 1420 including, but not limited to the thickness of a layer 1422, the chemical composition of the layer 1422, the opacity and/or reflectivity of the layer 1422, the thickness of a layer 1424, the chemical composition of the layer 1424, the opacity and/or reflectivity of the layer 1424, the thickness of a layer 1426, the chemical composition of the layer 1426, and the opacity and/or reflectivity of the layer 1426 can affect the reflection and/or refraction of the incident light 1440. Additionally, properties of the immersion medium can include, for example, refractive index, lithographic constant, etc. Thus, a complex reflected and/or refracted light 1442 may result from the incident light 1440 interacting with the features 1428, and/or the layers 1422, 1424 and 1426. Although three layers 1422, 1424 and 1426 are illustrated, it is to be appreciated that a substrate can be formed of a greater or lesser number of such layers. According to one aspect of the present invention, a substrate with a known grating structure build upon it is utilized, which facilitates deriving characteristics of the immersion medium (e.g., refractive index, lithographic constant) by detecting scattered light.

Figure 15:
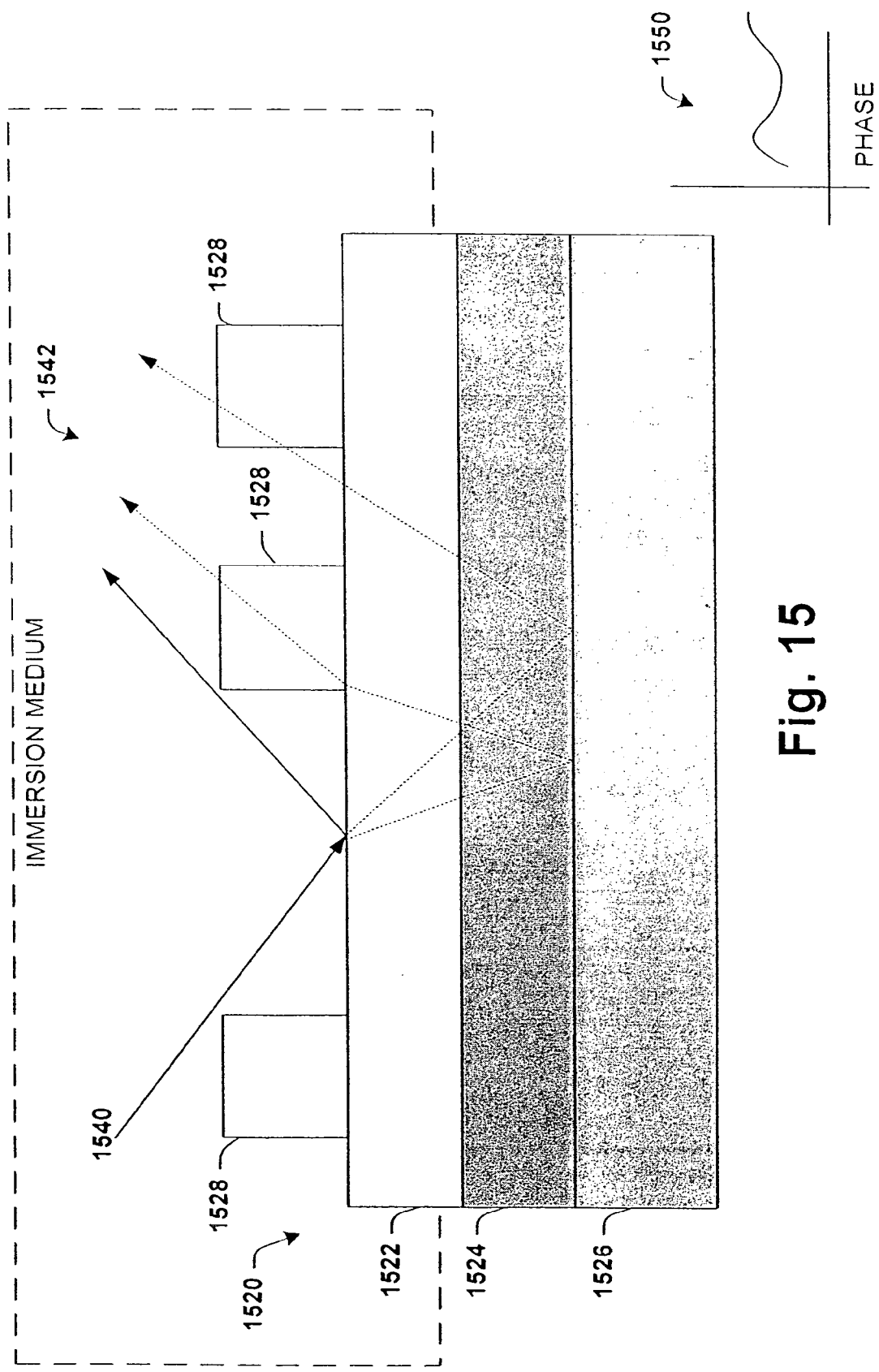
FIG. 15 is an illustration of a complex reflected and refracted light produced when an incident light is directed onto a surface in accordance with one or more aspects of the present invention.
Figure 16:
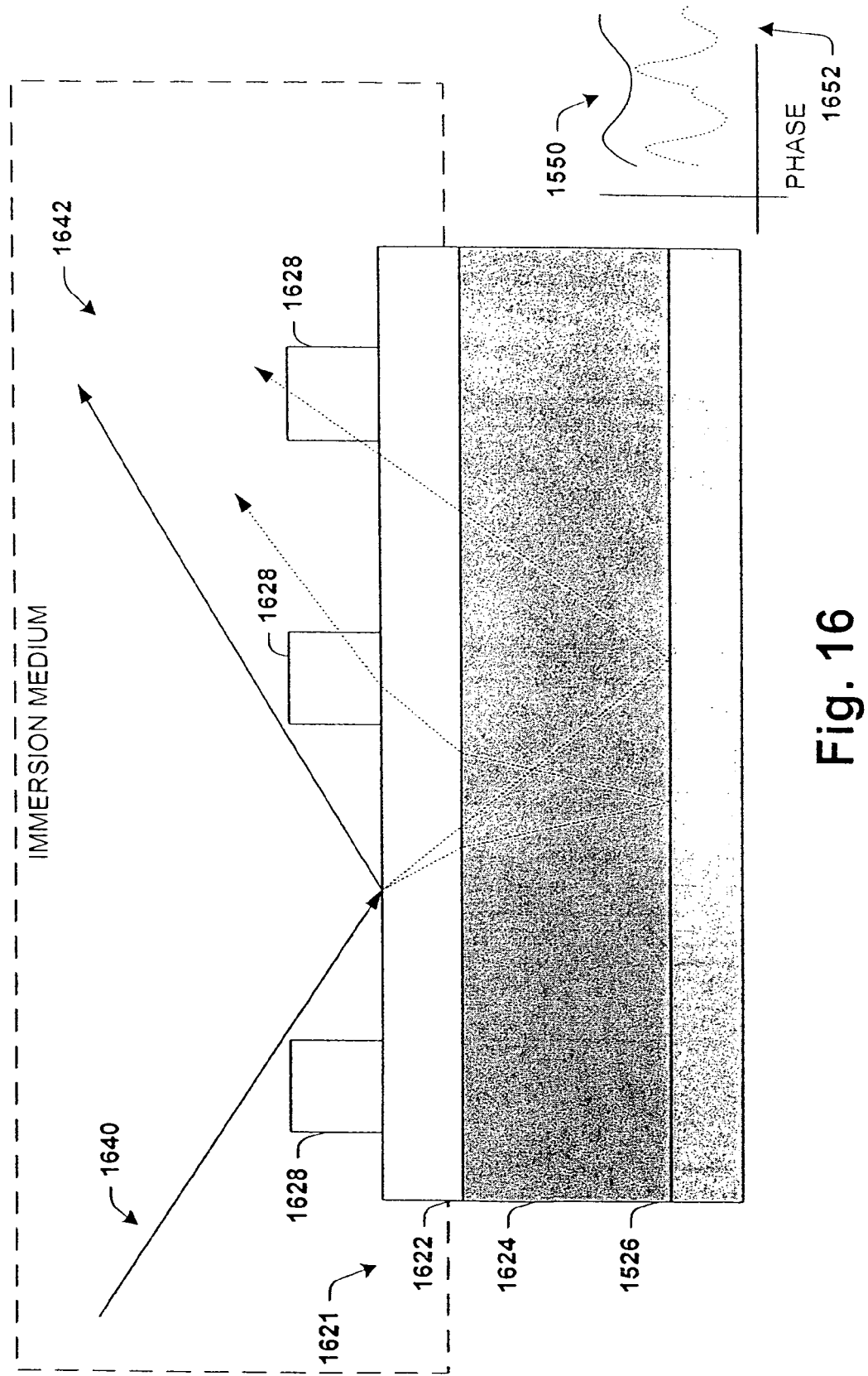
FIG. 16 is an illustration of a complex reflected and refracted light produced when an incident light is directed onto a surface in accordance with one or more aspects of the present invention.

Turning now to FIG. 15, one of the properties from FIG. 14 is illustrated in greater detail. The substrate 1520 can be formed of one or more layers 1522, 1524 and 1526. The phase 1550 of the reflected and/or refracted light 1542 can depend, at least in part, on the thickness of a layer, for example, the layer 1524. Thus, in FIG. 16, the phase 1650 of a reflected light 1642 differs from the phase 1550 due, at least in part, to the different thickness of the layer 1624 in FIG. 18 from the thickness of the layer 1524 in FIG. 15.

Thus, scatterometry is a technique that can be employed to extract information about a surface and/or immersion medium upon which an incident light has been directed. The information can be extracted by analyzing phase and/or intensity signals of a complex reflected and/or diffracted light. The intensity and/or the phase of the reflected and/or diffracted light will change based on properties of the surface and/or immersion medium upon which the light is directed, resulting in substantially unique signatures that can be analyzed to determine one or more properties of the surface and/or immersion medium upon which the incident light was directed.

Figure 18:
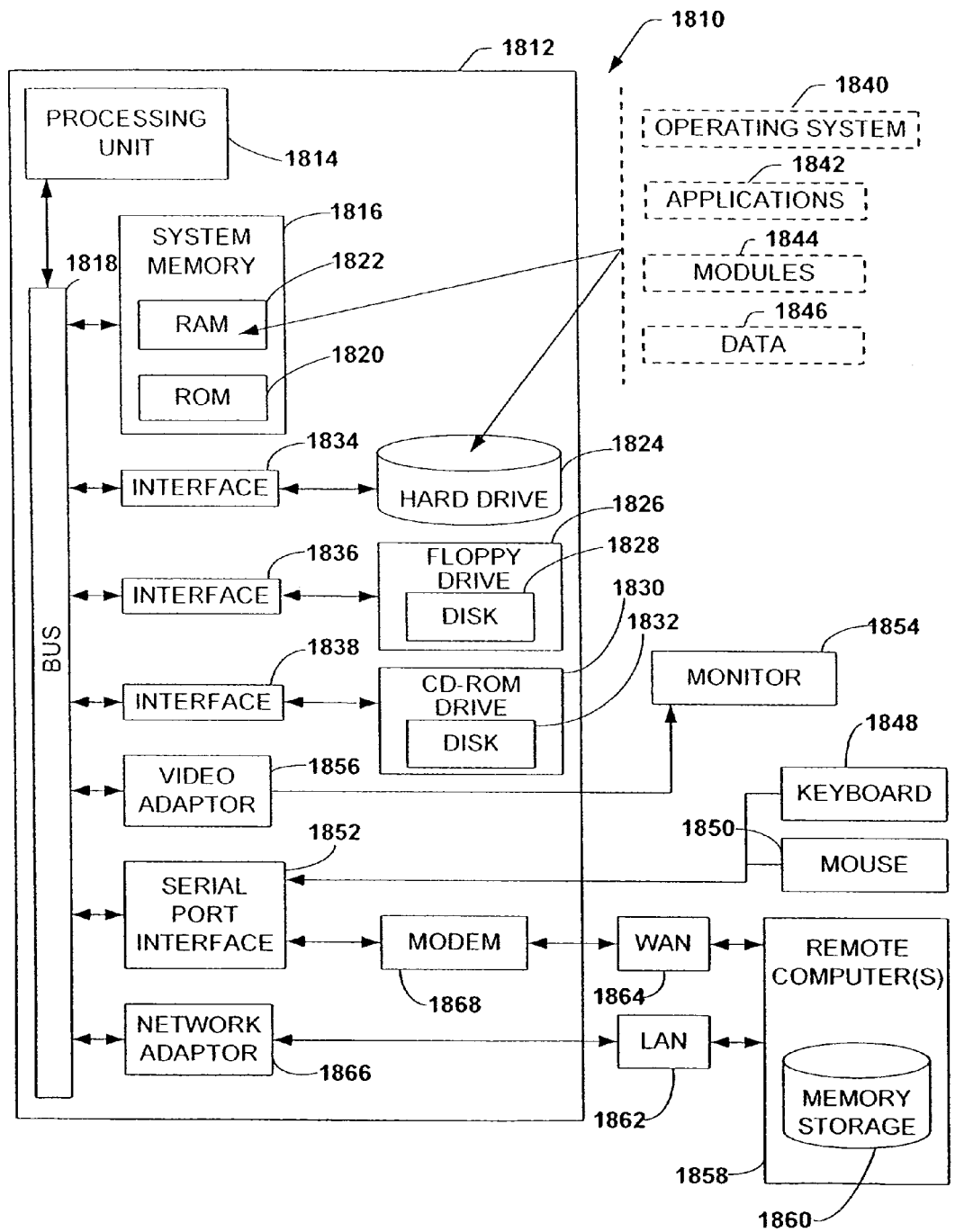
FIG. 18 is an illustration of an exemplary computing system and/or environment in connection with facilitating employment of the subject invention.

In order to provide additional context for various aspects of the present invention, FIG. 18 and the following discussion are intended to provide a brief, general description of a suitable computing environment 1810 in which the various aspects of the present invention can be implemented. While the invention has been described above in the general context of computer-executable instructions that may run on one or more computers, those skilled in the art will recognize that the invention also may be implemented in combination with other program modules and/or as a combination of hardware and software. Generally, program modules include routines, programs, components, data structures, etc. that perform particular tasks or implement particular abstract data types. Moreover, those skilled in the art will appreciate that the inventive methods may be practiced with other computer system configurations, including single-processor or multiprocessor computer systems, minicomputers, mainframe computers, as well as personal computers, hand-held computing devices, microprocessor-based or programmable consumer electronics, and the like, each of which may be operatively coupled to one or more associated devices. The illustrated aspects of the invention may also be practiced in distributed computing environments where certain tasks are performed by remote processing devices that are linked through a communications network. In a distributed computing environment, program modules may be located in both local and remote memory storage devices.

With reference to FIG. 18, an exemplary environment 1810 for implementing various aspects of the invention includes a computer 1812, including a processing unit 1814, a system memory 1816, and a system bus 1818 that couples various system components including the system memory to the processing unit 1814. The processing unit 1814 may be any of various commercially available processors. Dual microprocessors and other multi-processor architectures also can be used as the processing unit 1814.

The system bus 1818 can be any of several types of bus structure including a memory bus or memory controller, a peripheral bus, and a local bus using any of a variety of conventional bus architectures such as PCI, VESA, Microchannel, ISA, and EISA, to name a few. The system memory 1816 includes read only memory (ROM) 1820 and random access memory (RAM) 1822. A basic input/output system (BIOS), containing the basic routines that help to transfer information between elements within the computer 1812, such as during start-up, is stored in ROM 1820.

The computer 1812 further includes a hard disk drive 1824, a magnetic disk drive 1826 to read from or write to, for example, a removable disk 1828, and an optical disk drive 1830 for reading, for example, from a CD-ROM disk 1832 or to read from or write to other optical media. The hard disk drive 1824, magnetic disk drive 1826, and optical disk drive 1830 are connected to the system bus 1818 by a hard disk drive interface 1834, a magnetic disk drive interface 1836, and an optical drive interface 1838, respectively. The drives and their associated computer-readable media provide nonvolatile storage of data, data structures, computer-executable instructions, etc. for the computer 1812, including for the storage of broadcast programming in a suitable digital format. Although the description of computer-readable media above refers to a hard disk, a removable magnetic disk and a CD, it should be appreciated by those skilled in the art that other types of media which are readable by a computer, such as magnetic cassettes, flash memory cards, digital video disks, Bernoulli cartridges, and the like, may also be used in the exemplary operating environment, and further that any such media may contain computer-executable instructions for performing the methods of the present invention.

A number of program modules may be stored in the drives and RAM 1822, including an operating system 1840, one or more application programs 1842, other program modules 1844, and program data 1846. The operating system 1840 in the illustrated computer is, for example, the "Microsoft® Windows® NT" operating system, although it is to be appreciated that the present invention may be implemented with other operating systems or combinations of operating systems, such as UNIX®, LINUX®, etc.

A user may enter commands and information into the computer 1812 through a keyboard 1848 and a pointing device, such as a mouse 1850. Other input devices (not shown) may include a microphone, an IR remote control, a joystick, a game pad, a satellite dish, a scanner, or the like. These and other input devices are often connected to the processing unit 1814 through a serial port interface 1852 that is coupled to the system bus 1818, but may be connected by other interfaces, such as a parallel port, a game port, a universal serial bus ("USB"), an IR interface, etc. A monitor 1854 or other type of display device is also connected to the system bus 1818 via an interface, such as a video adapter 1856. In addition to the monitor, a computer typically includes other peripheral output devices (not shown), such as speakers, printers etc.

The computer 1812 may operate in a networked environment using logical connections to one or more remote computers, such as a remote computer(s) 1858. The remote computer(s) 1858 may be a workstation, a server computer, a router, a personal computer, microprocessor based entertainment appliance (e.g., a WEBTV® client system), a peer device or other common network node, and typically includes many or all of the elements described relative to the computer 1812, although, for purposes of brevity, only a memory storage device 1860 is illustrated. The logical connections depicted include a local area network (LAN) 1862 and a wide area network (WAN) 1864. Such networking environments are commonplace in offices, enterprise-wide computer networks, intranets and the Internet.

When used in a LAN networking environment, the computer 1812 is connected to the local network 1862 through a network interface or adapter 1866. When used in a WAN networking environment, the computer 1812 typically includes a modem 1868, or is connected to a communications server on the LAN, or has other means for establishing communications over the WAN 1864, such as the Internet. The modem 1868, which may be internal or external, is connected to the system bus 1818 via the serial port interface 1852 to enable communications, for example, via POTS. The modem 1868 may also, in an alternative embodiment, be connected to the network adaptor 1866 to enable communications, for example, via DSL or cable. In a networked environment, program modules depicted relative to the computer 1812, or portions thereof, will be stored in the remote memory storage device 1860. It may be appreciated that the network connections shown are exemplary and other means of establishing a communications link between the computers may be used.

Described above are preferred aspects of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A system that evaluates a refractive index of an immersion medium, comprising:
    a receiver that obtains data related to an immersion medium;
    an analyzer that utilizes the data to identify a refractive index of the immersion medium; and
    a memory component in which the identified refractive index of the immersion medium is stored.

2. The system of claim 1, the receiver obtains a signal that traversed through the immersion medium.

3. The system of claim 1, the receiver obtains a signal that is at least one of reflected, refracted, or diffracted.

4. The system of claim 1, the immersion medium is at least one of water, perfluorinated polyether, ozone vapor, and supercritical fluid in gaseous phase.

5. The system of claim 1, the immersion medium has a refractive index greater than the refractive index of air.

6. The system of claim 1, the immersion medium is approximately 100% transparent to an exposure wavelength of a signal employed in connection with photolithographic processing.

7. The system of claim 1, the analyzer further utilizes the data to identify a lithographic constant value (k) of the immersion medium.

8. The system of claim 1, further comprising a semiconductor wafer that is fabricated at least in part via the immersion medium.

9. The system of claim 8, the semiconductor wafer includes a known grating structure.

10. The system of claim 9, the known grating structure is at least one of a series of raised parallel marks, a series of parallel troughs, and a complex grating pattern.

11. The system of claim 8, further comprising a final optical component utilized for semiconductor fabrication.

12. The system of claim 11, a gap between the semiconductor wafer and the final optical component is filled with the immersion medium.

13. The system of claim 12, the gap is filled utilizing a drop of the immersion medium.

14. The system of claim 12, the gap is filled utilizing a pool of the immersion medium.

15. The system of claim 1, further comprising a component that varies the identified refractive index of the immersion medium.

16. The system of claim 1, the analyzer continuously identifies the refractive index of the immersion medium.

17. The system of claim 1, further comprising a transmitter that emits a signal into the immersion medium, the signal yields the data obtained via the receiver.

18. The system of claim 17, the transmitter is at least one of a frequency stabilized laser, a laser diode, a helium neon gas laser, and a halogen lamp.

19. A system that maintains a refractive index of an immersion medium, comprising:
    a first component that tracks a refractive index of an immersion medium by at least comparing an observed sire to a stored signature; and
    a second component that adjusts the refractive index of the immersion medium when the refractive index is outside of a predetermined range.

20. The system of claim 19, the second component adjusts the refractive index by at least one of changing a temperature of the immersion medium, varying a pressure of the immersion medium, and displacing the volume of immersion medium with a disparate volume of immersion medium.

21. The system of claim 19, the second component adjusts the refractive index of the entire volume of immersion medium.

22. The system of claim 19, the second component adjusts the refractive index of a portion of the entire volume of immersion medium.

23. The system of claim 19, the first component tacks the refractive index continuously.

24. The system of claim 19, the first component tracks the refractive index in part by comparing an observed signature to a modeled signature.

25. A system, comprising:
    means for obtaining a refractive index and a lithographic constant of an immersion medium; and
    means for changing the refractive index and the lithographic constant.

26. The system of claim 25, further comprising means for analyzing when at least one of the refractive index and lithographic constant fails to be within a predetermined range.

27. The system of claim 26, further comprising means for initiating the means for changing the refractive index and the lithographic constant when at least one of the refractive index and lithographic constant fails to be within the predetermined range.

28. A method for maintaining a refractive index of an immersion medium within a predetermined range, comprising:
    assessing a refractive index of an immersion medium;
    determining whether the refractive index is within a predetermined range; and
    altering the refractive index when the refractive index is outside of the predetermined range, at least in part by clanging a pressure of the immersion medium.

29. The method of claim 28, further comprising:
    ascertaining a lithographic constant of the immersion medium;
    identifying whether the lithographic constant of the immersion medium is outside of a second predetermined range; and
    varying the lithographic constant when the lithographic constant is outside of the predetermined range.

30. The method of claim 28, assessing the refractive index further comprises comparing a measured signature with a stored signature.

31. The method of claim 28, assessing the refractive index further comprises comparing a measured signature with a modeled signature.

32. The method of claim 28, altering the refractive index fiber comprises changing a temperature of the immersion medium.

33. The method of claim 28, altering the refractive index further comprises removing the immersion medium.

34. The method of claim 33, further comprising adding a disparate volume of immersion medium.

35. The method of claim 28, further comprising stopping photolithographic fabrication upon determining the refractive index is outside of the predetermined range.

* * * * *